(12) United States Patent
Kato et al.

(10) Patent No.: US 10,651,150 B2
(45) Date of Patent: May 12, 2020

(54) MULTICHIP MODULE INCLUDING SURFACE MOUNTING PART EMBEDDED THEREIN

(71) Applicant: MITSUBISHI HEAVY INDUSTRIES, LTD., Tokyo (JP)

(72) Inventors: Masahiro Kato, Tokyo (JP); Yoshikatsu Kuroda, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/124,206

(22) PCT Filed: Jan. 28, 2015

(86) PCT No.: PCT/JP2015/052411
§ 371 (c)(1),
(2) Date: Sep. 7, 2016

(87) PCT Pub. No.: WO2015/136998
PCT Pub. Date: Sep. 17, 2015

(65) Prior Publication Data
US 2017/0025383 A1 Jan. 26, 2017

(30) Foreign Application Priority Data
Mar. 10, 2014 (JP) ................................. 2014-046582

(51) Int. Cl.
*H01L 25/065* (2006.01)
*H01L 23/13* (2006.01)
(Continued)

(52) U.S. Cl.
CPC ...... *H01L 25/0657* (2013.01); *H01L 21/4857* (2013.01); *H01L 23/13* (2013.01);
(Continued)

(58) Field of Classification Search
CPC ............. H01L 25/0657; H01L 25/0652; H01L 25/0655; H01L 25/50; H01L 21/4857;
(Continued)

(56) References Cited

U.S. PATENT DOCUMENTS

2004/0238935 A1* 12/2004 Yoshimura ........ H01L 23/49833
257/686
2006/0216857 A1* 9/2006 Zhao ....................... H01L 21/50
438/106
(Continued)

FOREIGN PATENT DOCUMENTS

CN 103400830 11/2013
JP 2791429 8/1998
(Continued)

OTHER PUBLICATIONS

Extended European Search Report dated Dec. 21, 2016 in corresponding European Application No. 15762051.9.
(Continued)

*Primary Examiner* — Matthew E. Gordon
(74) *Attorney, Agent, or Firm* — Wenderoth, Lind & Ponack, L.L.P.

(57) ABSTRACT

A multichip module includes a plurality of semiconductor substrates and a plurality of surface mounting parts. The plurality of semiconductor substrates each have a wiring line region which contains a wiring line to pierce from one of the surfaces to the other surface. A plurality of surface mounting parts are mounted on either of the plurality of surface mounting parts. The plurality of semiconductor substrates are stacked to form a multilayer structure. The first surface mounting part as at least one of the plurality of surface mounting parts is arranged in an inside region of the multilayer structure.

13 Claims, 20 Drawing Sheets

(51) Int. Cl.
*H01L 21/48* (2006.01)
*H01L 23/14* (2006.01)
*H01L 23/498* (2006.01)
*H01L 23/48* (2006.01)
*H01L 25/00* (2006.01)

(52) U.S. Cl.
CPC .......... *H01L 23/147* (2013.01); *H01L 23/481* (2013.01); *H01L 23/49822* (2013.01); *H01L 25/0652* (2013.01); *H01L 25/0655* (2013.01); *H01L 25/50* (2013.01); *H01L 23/49827* (2013.01); *H01L 23/49833* (2013.01); *H01L 2224/16225* (2013.01); *H01L 2224/32225* (2013.01); *H01L 2224/73204* (2013.01); *H01L 2225/06517* (2013.01); *H01L 2225/06541* (2013.01); *H01L 2225/06572* (2013.01); *H01L 2924/15311* (2013.01)

(58) Field of Classification Search
CPC ..... H01L 23/13; H01L 23/147; H01L 23/481; H01L 23/49822
See application file for complete search history.

(56) References Cited

U.S. PATENT DOCUMENTS

| | | | |
|---|---|---|---|
| 2007/0007641 A1 | 1/2007 | Lee et al. | |
| 2008/0117607 A1* | 5/2008 | Murayama | H01L 21/4846 361/760 |
| 2008/0237830 A1* | 10/2008 | Ino | B81C 1/0023 257/690 |
| 2009/0115049 A1 | 5/2009 | Shiraishi et al. | |
| 2009/0212407 A1* | 8/2009 | Foster | B81B 7/0006 257/686 |
| 2011/0226731 A1* | 9/2011 | Funabiki | H01L 41/332 216/20 |
| 2011/0272795 A1 | 11/2011 | Chang | |

FOREIGN PATENT DOCUMENTS

| | | |
|---|---|---|
| JP | 2003-318219 | 11/2003 |
| JP | 3748283 | 2/2006 |
| JP | 2007-19454 | 1/2007 |
| JP | 3970304 | 9/2007 |
| JP | 2007-313594 | 12/2007 |
| JP | 2008-130934 | 6/2008 |
| JP | 2008-241481 | 10/2008 |
| JP | 2008-244317 | 10/2008 |
| JP | 2009-76588 | 4/2009 |
| JP | 2009-117611 | 5/2009 |
| JP | 2012-529770 | 11/2012 |
| KR | 2012-0091867 | 8/2012 |
| KR | 2013-0011171 | 1/2013 |
| WO | 2013/119643 | 8/2013 |

OTHER PUBLICATIONS

International Search Report dated Apr. 21, 2015 in corresponding International Application No. PCT/JP2015/052411.
International Preliminary Report on Patentability dated Sep. 13, 2016 in corresponding International Application No. PCT/JP2015/052411.
Office Action dated May 27, 2019 in European Patent Application No. 15762051.9.

* cited by examiner

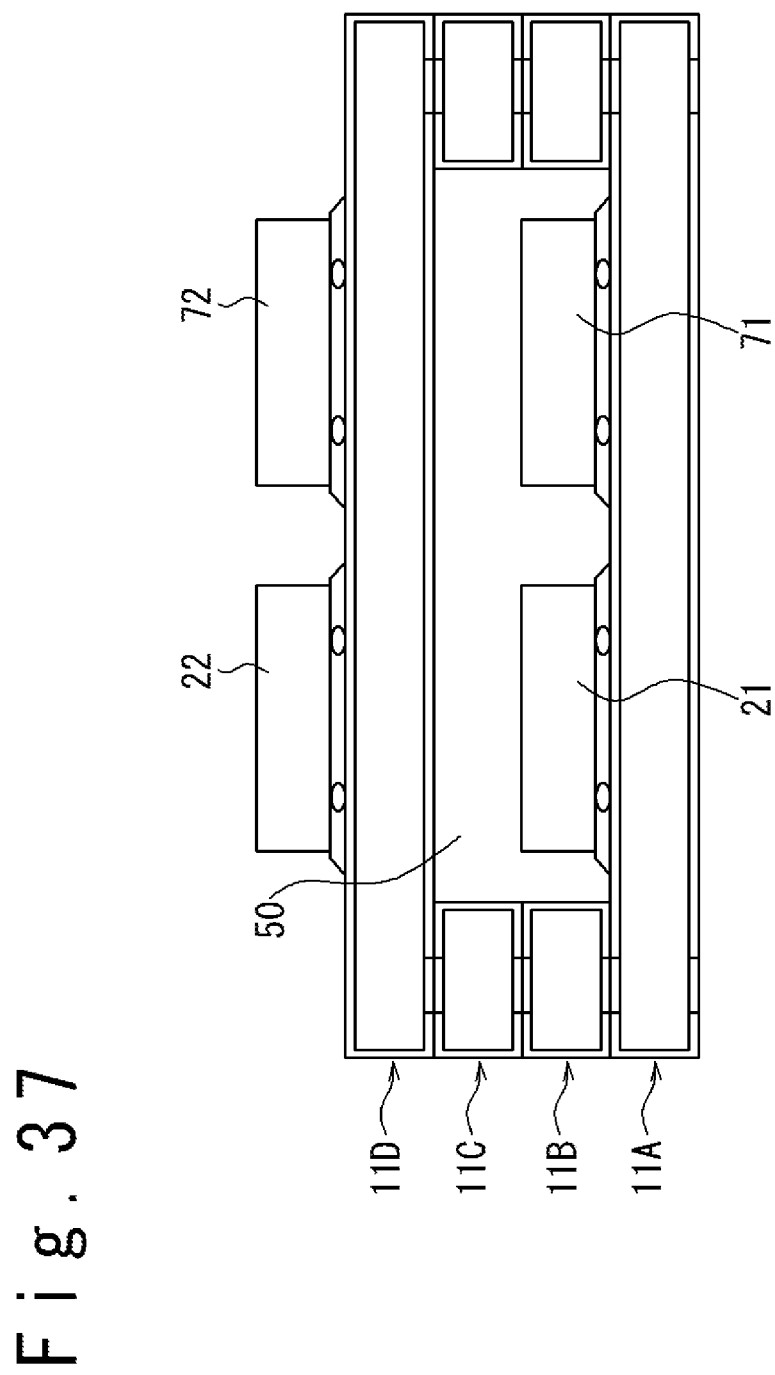

MULTICHIP MODULE INCLUDING SURFACE MOUNTING PART EMBEDDED THEREIN

TECHNICAL FIELD

The present invention related to a multichip module, an on board computer and a multichip module manufacturing method. Especially, the present invention relates to a multichip module, an on board computer, a sensor interface substrate and a multichip module manufacturing method, which are for an electronic equipment in which downsizing and lightening are required.

BACKGROUND ART

The downsizing and lightening of the electronic equipment are requested. Especially, in a small satellite, it is strongly required to achieve high functionality, high performance, downsizing and lightening of a satellite while maintaining the size of the satellite. Therefore, it is necessary to further carry out downsizing and high density mounting even in an electronic device such as an information processing apparatus mounted in the satellite. It is possible to cope with the downsizing of the information processing apparatus to an extent by the technique such as SOC (System On Chip), HIC (Hybrid IC), and MCM (Multi-Chip Module).

FIG. 1 is a side view schematically showing a configuration example of a conventional MCM. The MCM 101 contains a mount substrate 110, an IC package 111, an IC package 112 and wiring lines 113. The IC package 111 and the IC package 112 contain a semiconductor chip 121 and a semiconductor chip 122, respectively. The mount substrate 110 is a circuit board made from ceramic or resin. For example, the semiconductor chips 121 and 122 are each exemplified by a CPU, a memory, and a sensor. The wiring lines 113 provided inside the substrate 110 and on the surface of the substrate 110 connect the IC packages 111 and 112 and other electronic devices. In this case, the line width of the wiring line 113 is wide (the minimum width of about 200 μm) and it needs to secure an area necessary for the wiring lines. Therefore, the substrate 110 cannot be made small. For this reason, it is difficult that the downsizing and lightening of the MCM 101 are dealt with.

As the related techniques, in JP 2012-529770A (WO2010/151350) discloses a method of providing a multichip package and inter-connection from a die to a die in the multichip package. The multichip package contains a substrate, a first die, a second die and a bridge. The substrate has a first surface, a second surface opposite to it, and a third surface extending from the first surface to the second surface. The first die and the second die are mounted on the first surface of the substrate. The bridge is mounted on the first die and the second die adjacent to the third surface of the substrate. Any part of the substrate does not exist under the bridge. The bridge connects the first die and the second die.

In this prior art, there is a case that the second die is mounted on the first die mounted on the substrate (there is a case that the bridge is the die). In such a case, the wiring line of the second die mounted on the upper side needs to pass through the first die mounted on the lower side. Therefore, it would be a restriction of height when mounting the dies in a height direction.

The technique of room-temperature bonding which can bond semiconductor substrates at the normal temperature is disclosed in Japanese Patent 2,791,429B, Japanese Patent 3,970,304B and JP 2003-318219A.

CITATION LIST

[Patent Literature 1] JP 2012-529770A
[Patent Literature 2] JP 2791429B
[Patent Literature 3] JP 3970304B
[Patent literature 4] JP 2003-318219A

SUMMARY OF THE INVENTION

An object of the present invention is to provide a multichip module, an on board computer, and a method of manufacturing a multichip module, in which the downsizing and lightening are possible while maintaining a performance. Another object of the present invention is to provide a multichip module, an on board computer and a multichip module manufacturing method, in which there is no limitation of the number of stacked layers theoretically while maintaining a performance.

The above objects, objects except for the above objects and benefits of the present invention can be easily understood from the following description and the attached drawings.

A multichip module of the present invention includes a plurality of semiconductor substrates and a plurality of surface mounting parts. The plurality of semiconductor substrates each have a wiring line region which contains a wiring line to pierce from one of the surfaces of the substrate to the other surface. The plurality of surface mounting parts are mounted on either of the plurality of semiconductor substrates. The plurality of semiconductor substrates are stacked to form a multilayer structure. A first surface mounting part as at least one of the plurality of surface mounting parts is arranged and mounted in the inside region of the multilayer structure.

Because such a multichip module uses the semiconductor substrate as a mount substrate, the wiring line determined according to a wiring line rule of the semiconductor substrate can be used as the wiring line of the mount substrate. Thus, the wiring line can be miniaturized and the wiring line region to be occupied on the mount substrate can be reduced. In addition, the surface mounting part and the mount substrate can be structured in the height direction three-dimensionally. In this way, an area required to mount the multichip module without changing the whole area of the mount substrate can be reduced. Thus, it becomes possible to remarkably downsize and lighten the multichip module and make the multichip module to a high-density. Also, because a semiconductor substrate can be used as the mount substrate, the present invention is predominant in the viewpoint of the radiation design, because the heat conduction is better, compared with a substrate made from resin and a substrate made from ceramics.

An on board computer of the present invention includes a multichip module and an interface. The multichip module is mounted on a mount substrate, and contains a CPU and a memory as surface mounting parts. The interface inputs and outputs data of the multichip module.

Because such an on board computer uses the above-mentioned multichip module, the downsizing, the lightening and the high-density mounting can be realized.

A multichip module manufacturing method of the present invention includes preparing a first semiconductor substrate, a second semiconductor substrate and a third semiconductor substrate, which each have a wiring line region which contains a wiring line to pierce from one of the surfaces to the other surface. The second semiconductor substrate is stacked and bonded on the first semiconductor substrate by a room-temperature bonding method. A first surface mounting part is mounted on a part of the first semiconductor substrate where it is not covered with the second semiconductor substrate. The third semiconductor substrate is stacked and bonded on the second semiconductor substrate by the room-temperature bonding method to cover the first surface mounting part.

In such a multichip module manufacturing method, the plurality of semiconductor substrates are stacked by the room-temperature bonding method. Therefore, a heat load is never applied to a surface mounting part upon stacking. Therefore, there is no fear that a surface mounting part is broken in an assembling step, and the yield is improved. Also, the manufactured multichip module has the above-mentioned configuration and can realize downsizing, lightening and high-density mounting and so on.

By the present invention, it is possible to provide the multichip module, the on board computer and the multichip module manufacturing method, in which the downsizing and the lightening are possible while maintaining a performance. Also, it is possible to provide the multichip module, the on board computer and the multichip module manufacturing method, in which there is no limitation of the number of layers theoretically while maintaining a performance.

BRIEF DESCRIPTION OF THE DRAWINGS

The objects, effects, and features of the above invention would become clear from the description of the embodiments in cooperation with the attached drawings.

FIG. 37 is a sectional view schematically showing the modification example of the configuration of the multichip module according to the embodiment.

DESCRIPTION OF THE EMBODIMENTS

Hereinafter, a multichip module, an on board computer and a multichip module manufacturing method according to embodiments of the present invention will be will be described with reference to the attached drawings.

Figure 1:
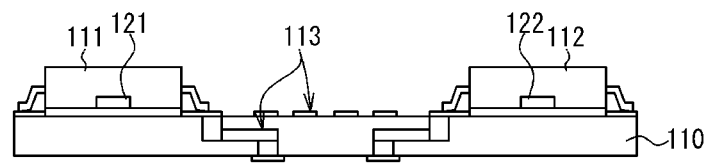
FIG. 1 is a side view schematically showing a configuration example of a conventional MCM.
Figure 2A:
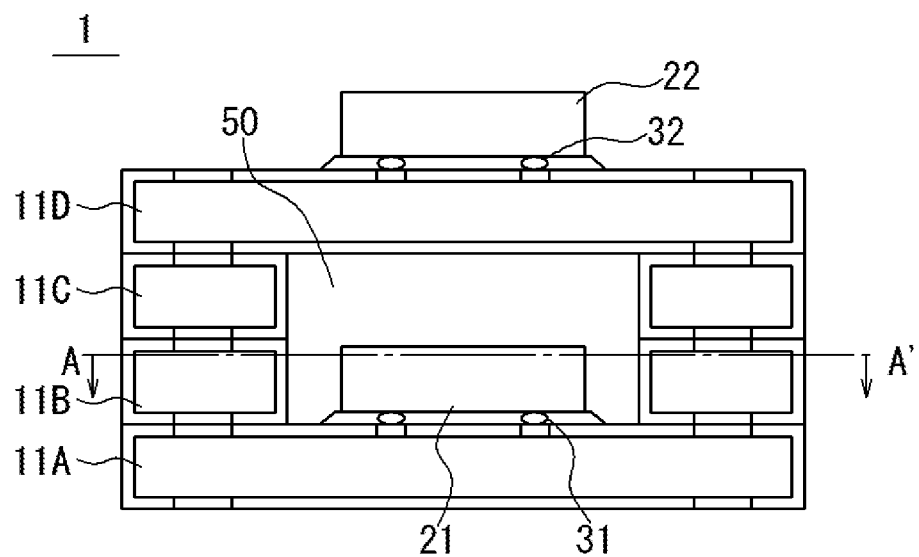
FIG. 2A is a vertical sectional view schematically showing a configuration example of a multichip module according to an embodiment.
Figure 2B:
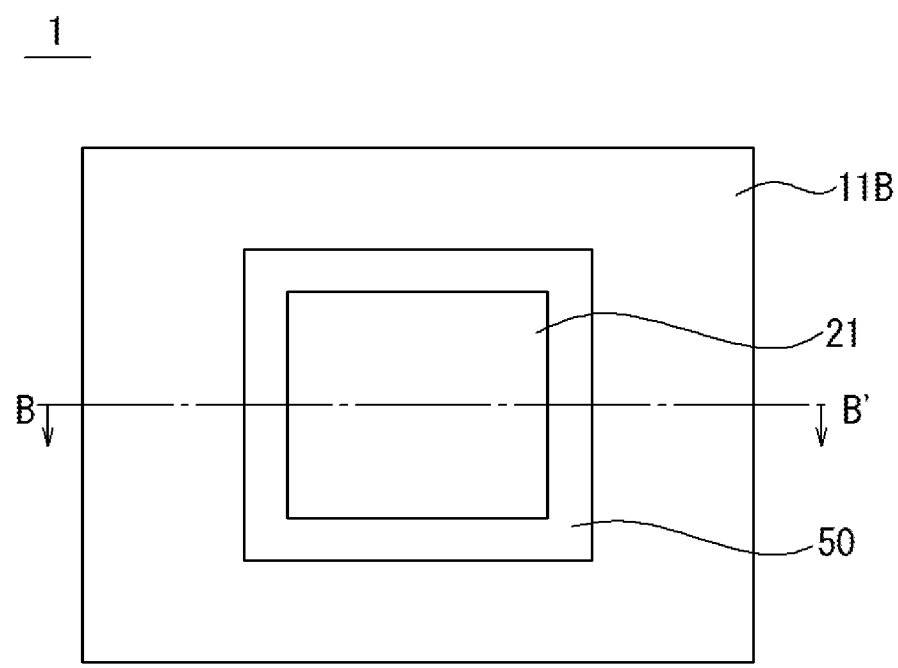
FIG. 2B is a horizontal sectional view schematically showing the configuration example of the multichip module according to the embodiment.

The configuration of the multichip module according to an embodiment will be described. FIG. 2A and FIG. 2B are sectional views schematically showing a configuration example of the multichip module according to the present embodiment. Here, FIG. 2A is the vertical sectional view along the BB' line in FIG. 2B and FIG. 2B is the horizontal sectional view along the AA' line in FIG. 2A. The multichip module 1 contains a plurality of semiconductor substrates 11A, 11B, 11C and 11D and a plurality of semiconductor chips 21 and 22 as a plurality of surface mounting parts (SMD).

Each of the plurality of semiconductor substrates 11A, 11B, 11C and 11D has a wiring line region which contains a wiring line passing through the substrate from one surface to the other surface (not shown). The plurality of semiconductor substrates 11A, 11B, 11C and 11D are exemplified by silicon substrates. In this case, the wiring line passing through the substrate from the one surface to the other surface is so-called TSV (Through Silicon Via). The wiring line region of each semiconductor substrate contains one or plural wiring line layers which are formed in the surface region on one surface side. The wiring line region of each semiconductor substrate may contain electronic devices such as a transistor, a diode, a resistance and a capacitance which are formed in the surface region, or may contain a logic circuit and a memory circuit. These wiring line regions can be formed by using a microfabrication process of a semiconductor integrated circuit. The plurality of semiconductor substrates 11A, 11B, 11C and 11D are stacked in this order. The wiring line regions of the plurality of semiconductor substrates 11A, 11B, 11C and 11D are connected by the passing wiring lines (e.g. TSV).

Each of the plurality of semiconductor chips 21 and 22 is a die (a bare chip). Each of the plurality of semiconductor chips 21 and 22 is exemplified by a memory, a CPU (Central Processing Unit), a peripheral circuit (e.g. ASIC (Application Specific Integrated Circuit)), a sensor (e.g. CCD (Charge Coupled Device)), an analog circuit, and a MEMS (Micro Electro Mechanical Systems) which is packaged in a wafer level, and a combination of them. In this example, the semiconductor chip 21 is a memory and the semiconductor chip 22 is a CPU. The semiconductor chip 21 is arranged (mounted) on the semiconductor substrate 11A, and is connected by flip-chip bonding. That is, a pad (connected with an internal circuit) on the undersurface of the semiconductor chip 21 and a pad (connected with a wiring line region) on the upper surface of the semiconductor substrate 11A are connected through a bump (gold, solder, etc.) 31. In the same way, the semiconductor chip 22 is arranged (mounted) on the semiconductor substrate 11D, and is connected by the flip chip bonding. That is, a pad (connected with an internal circuit) on the undersurface of the semiconductor chip 22 and a pad (connected with the wiring line region) on the surface of the semiconductor substrate 11D are connected through a bump (gold, solder, etc.) 32. In this way, a semiconductor chip is connected with another semiconductor chip through the wiring lines of the wiring line region provided in the semiconductor substrate.

The semiconductor substrate 11A has the semiconductor chip 21 arranged (mounted) on one surface. The semiconductor substrate 11B is arranged on the semiconductor substrate 11A on the same side as the semiconductor chip 21. In other words, the semiconductor substrate 11B is stacked on the semiconductor substrate 11A to surround the periphery of the semiconductor chip 21 away from the semiconductor chip 21 (surround a predetermined region 50). The semiconductor substrate 11C is arranged on the semiconductor substrate 11B on the same side as the semiconductor chip 21. In other words, the semiconductor substrate 11C is stacked on the semiconductor substrate 11B to surround the periphery of the semiconductor chip 21 (surround the predetermined region 50). The semiconductor substrate 11D is arranged to cover the semiconductor chip 21 (to cover the predetermined region 50) so that the semiconductor substrate 11D is stacked on the semiconductor substrate 11C. That is, the predetermined region 50 (a predetermined space) is a region provided inside the stacked semiconductor substrates 11A to 11D (formed by the semiconductor substrates 11A to 11D). The semiconductor chip 21 is arranged in the predetermined region 50. Therefore, the semiconductor chip 21 is arranged inside the stacked semiconductor substrates 11A to 11D. On the semiconductor substrate 11D, the semiconductor chip 22 is mounted. Note that in the present embodiment, the semiconductor chip 22 is mounted on the semiconductor substrate 11D. However, the present invention is not limited to this, and the semiconductor chip 22 may be not mounted on the semiconductor substrate 11D.

Note that the semiconductor substrate 11C may be integrated with the semiconductor substrate 11B to form a unitary body. Also, when the thickness of the semiconductor chip 21 (containing the thickness of bump 31) is sufficiently thinner than the thickness of the semiconductor substrate 11B, the semiconductor substrate 11C may be eliminated. Also, the semiconductor chips 21 and 22 may be an IC chip package. The number of semiconductor substrates and the number of semiconductor chips are not limited to the above example (four semiconductor substrates and two semiconductor chips), and these may be more or less, to be described later.

In this way, the multichip module 1 according to the present embodiment has the configuration of multilayer configuration (three-dimensional configuration) in which the plurality of semiconductor substrates 11A to 11D are stacked. The semiconductor chip (die) 21 is embedded in the multilayer configuration (the three-dimensional configuration) (the semiconductor chip 21 is arranged in the predetermined region 50) to realize the three-dimensional implementation. Each of the semiconductor chips is connected with another semiconductor chip through wiring lines (wiring line layers, passing wiring lines) in the wiring line region provided for the semiconductor substrate. Therefore, as far as there is room in the space in a height direction, theoretically, there is not a limit in the number of layers stacked in the height direction. In addition, the wiring line regions of the plurality of semiconductor substrates 11A to 11D can be formed by using the micro-fabrication process of the semiconductor integrated circuit. That is, the wiring lines and the electronic devices can be manufactured finely. Thus, it becomes possible to carry out the downsizing and high-density mounting of the multichip module 1. Also, when the semiconductor substrates 11A to 11D as the mount substrates are silicon substrates, the heat conduction is better than a substrate made from resin and a substrate made from ceramics. Therefore, heat radiation of parts such as the semiconductor chips 21 and 22 (e.g. a CPU and a memory) are easy and the present embodiment is superior in the radiation design.

Figure 3A:
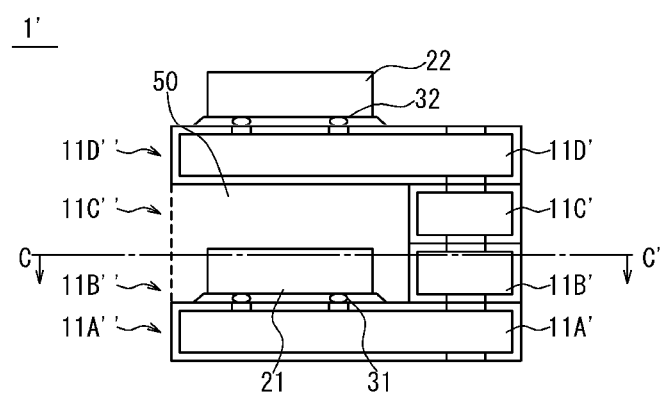
FIG. 3A is a vertical sectional view schematically showing another configuration example of the multichip module according to an embodiment.
Figure 3B:
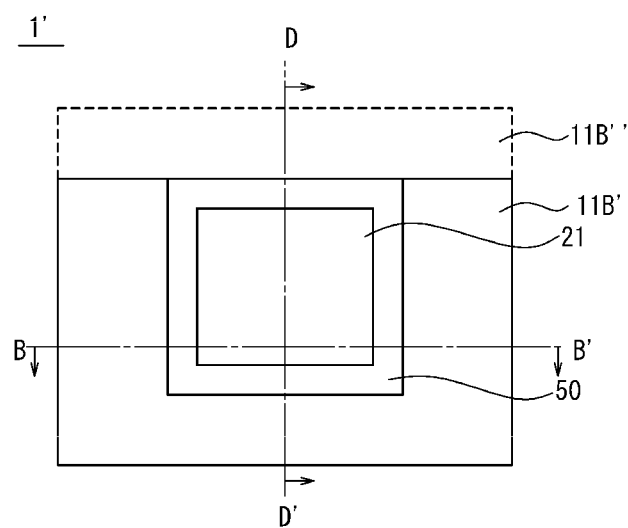
FIG. 3B is a horizontal sectional view schematically showing the other configuration example of the multichip module according to the embodiment.

Note that in the multichip module 1, the predetermined region (the space) 50 may be a closed space as shown in FIG. 2A and FIG. 2B, and may be an opened region (the space) as shown in FIG. 3A and FIG. 3B. FIG. 3A and FIG. 3B are sectional views schematically showing another configuration example of the multichip module according to the present embodiment. Here, FIG. 3A is a vertical sectional view along the DD' line in FIG. 3B and FIG. 3B is a horizontal sectional view along the CC' line in FIG. 3A. In a multichip module 1', semiconductor substrate sections 11A" to 11D" as a part of the semiconductor substrates 11A to 11D are omitted, compared with the multichip module 1. The multichip module 1' includes semiconductor substrates 11A' to 11D' and provides the region (the space) 50 having an opening. The effect like the multichip module 1 can be attained even in this case.

Also, in the multichip module 1' shown in FIG. 3, the predetermined region (the space) 50 is opened to a predetermined direction. However, the multichip module 1' may have the predetermined region opened into plural directions. For example, in an example of FIG. 3A and FIG. 3B, end sections of semiconductor substrates opposite to the open end (substrate ends 11A" to 11D") of the region 50 through the semiconductor chip 21 may be cut or omitted. Moreover, in FIG. 2A, FIG. 2B and FIG. 3A, and FIG. 3B, the outward form of the predetermined region (the space) 50 has a rectangular parallelepiped shape, but may have another shape. For example, as another shape, it is exemplified by a column shape.

Figure 4:
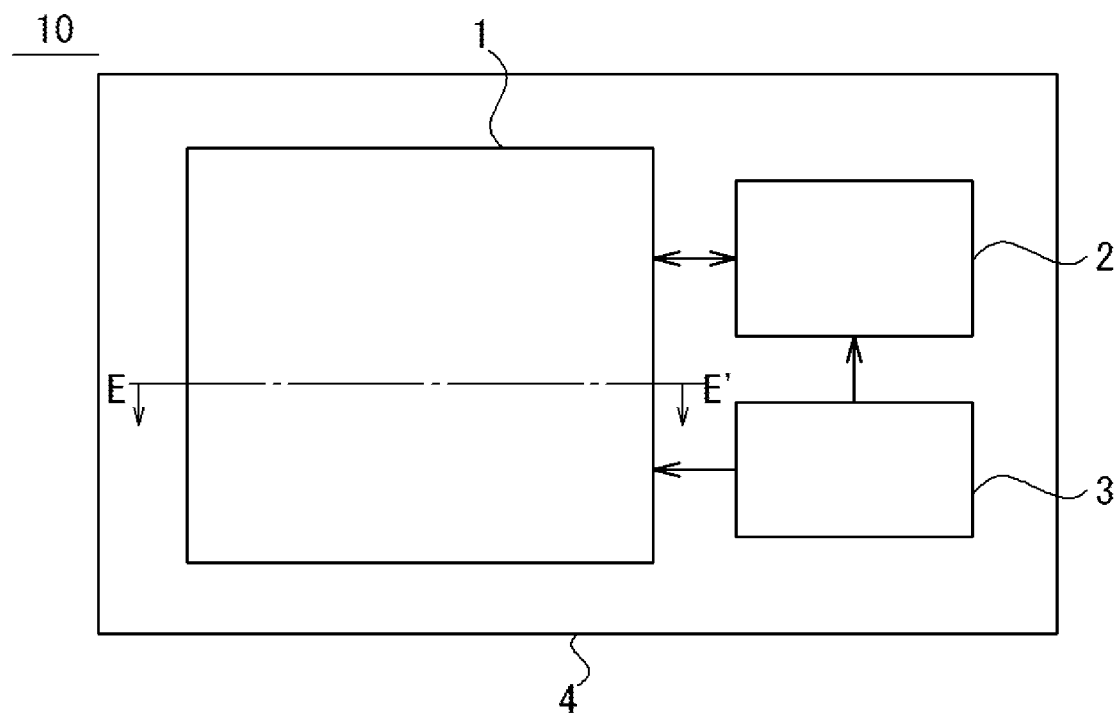
FIG. 4 is a block diagram schematically showing a configuration example of the on board computer according to the embodiment.

Next, the configuration of the on-board computer (OBC) according to the present embodiment will be described. FIG. 4 is a block diagram schematically showing a configuration example of the on-board computer according to the present embodiment. The on-board computer 10 contains a multichip module 1 mounted on the mount substrate 4, an external interface (I/F) 2 and a power supply 3. The multichip module 1 is as mentioned above, and contains the semiconductor chip 22 as the CPU and the semiconductor chip 21 as the memory at least. The external interface 2 is an input/output unit which inputs and outputs data between the multichip module 1 and an external unit. The power supply 3 supplies electric power to the multichip module 1 and the external interface 2. In this way, the on-board computer 10 configures a computer from the CPU (the semiconductor chip 22), the memory (the semiconductor chip 21) and the input/output unit (the external interface 2). For example, preferably, the on-board computer 10 according to the present invention is used as an interface substrate (calling an interface board or an extension card). Specifically, by mounting one of the semiconductor chips 21 and 22 as a sensor and the other as ASIC for data read, the on-board computer 10 functions as a sensor interface substrate.

Figure 5:
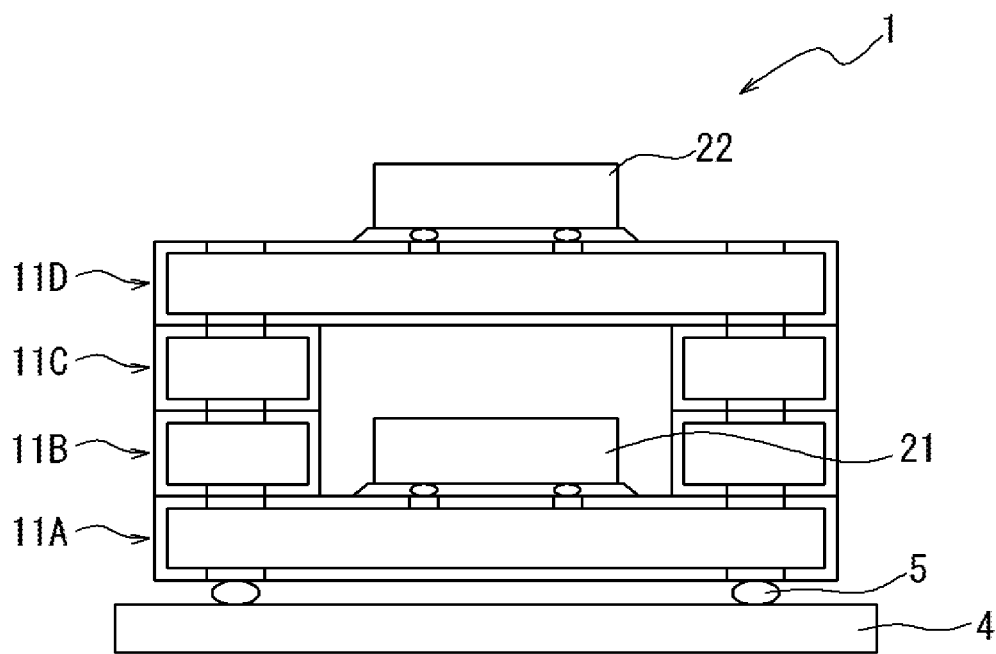
FIG. 5 is a partial sectional view schematically showing a configuration example of the on board computer according to an embodiment.

FIG. 5 is a partial sectional view schematically showing a configuration example of the on-board computer according to the present embodiment. Here, FIG. 5 is a sectional view along the EE' line in FIG. 4. In the on-board computer 10, the multichip module 1 is connected with the mount substrate 4 by the flip chip bonding. That is, a pad (connected with a wiring line passing through the semiconductor substrate 11A) on the undersurface of the semiconductor substrate 11A and a pad (connected with a wiring line on the mount substrate 4) on the upper surface of the mount substrate 4 are connected through a bump (gold, solder, etc.) 5. Note that the method of mounting the multichip module 1 on the mount substrate 4 may be carried out by wire bonding.

In this way, because the on-board computer 10 according to the present embodiment uses the multichip module 1 according to the present embodiment, the downsizing, high-density implementation and lighting become possible. By using such an on board computer 10 as a computer for the satellite mounting, the high functionality, superior performance, downsizing and lightening of the satellite become possible while maintaining the size of the whole satellite.

Next, the multichip module manufacturing method according to the present embodiment will be described. FIG. 6 to FIG. 12 are sectional views schematically showing the multichip module manufacturing method according to the present embodiment.

Figure 6:
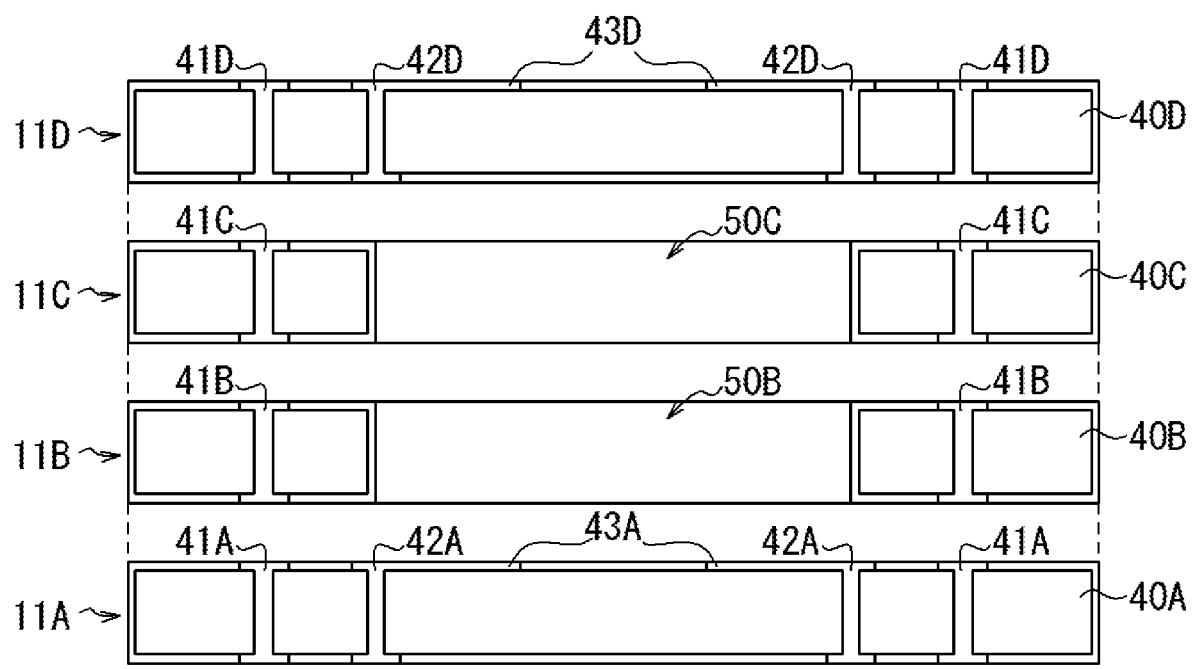
FIG. 6 is a sectional view schematically showing a multichip module manufacturing method according to an embodiment.

First, as shown in FIG. 6, the plurality of semiconductor substrates 11A to 11D are prepared. The plurality of semiconductor substrates 11A to 11D may be manufactured by a conventionally known method. For example, the following methods are proposed.

(1) The Semiconductor Substrates 11A and 11D

(Because being Formed by Almost the Same Method, a Case of the Semiconductor Substrate 11A Will be Described)

Electronic devices, wiring line layers and metal electrodes (pads) are formed in a surface region of one of the planes (hereinafter, to be referred to as a first plane) of a silicon substrate 40A. The surface of the first plane is covered with a flattened insulating layer and the metal electrodes are partially exposed. Next, the first surface is adhered to a glass support substrate, and a surface opposite to the first surface (the other surface of the silicon substrate 40A) is polished to make the silicon substrate 40 thin. The substrate 40A is exposed in the polished surface (hereinafter, to be referred to as the second surface). Next, the silicon substrate 40A is etched in a position of the second surface corresponding to the position of the metal electrode on the first surface to form a via-hole to pass from the second surface to the metal electrode of the first surface. After that, an insulating film (e.g. $SiO_2$) is formed to cover the walls of the second surface and the via-hole. Then, the insulating film in the bottom of the via-hole is etched to expose the metal electrode of the first surface in the bottom of the via-hole. Next, a barrier film (e.g. TiN) is formed to cover the inside of the via-hole and the second surface. Next, a metal film (e.g. Cu) is formed to bury the second surface and the via-hole. After that, the metal film on the second surface is polished with a CMP process to expose the second surface. Thus, a via-contact (via) of the metal film is completed in the via-hole. Next, the substrate 40A of the second surface is etched to become thin for the top part of the via-contact to protrude from the second surface slightly. Next, an insulating film (e.g. $SiO_2$) is formed to cover the top part of the via-contact and the second surface. After that, the insulating film (e.g. $SiO_2$) is removed from the top part of the via-contact by etching to expose the top part of the via-contact. A wiring line and a metal electrode (the pad) are formed in the insulating film according to need. As a result, via-contacts 41A and 42A as the wiring lines passing through the substrate 40A, and a metal electrode 43A connected with the via-contact 42A through the wiring line and a wiring line (not shown) are formed in the semiconductor substrate 11A. After that, the glass substrate adhered to the first surface is removed. Here, when an electronic device is not formed on the semiconductor substrate (e.g. the semiconductor substrate 11A), a wiring line layer can be formed in the semiconductor substrate as described below. That is, after the insulating film is formed by thermal oxidation and so on on the whole surface of the silicon wafer in which through holes are formed by etching exemplified by DeepRIE (Deep Reactive Ion Etching), Cu passing-through wiring lines and son on are formed by Cu embedding. Thus, the semiconductor substrate which has Cu passing-though wiring lines and so on is formed.

(2) Semiconductor Substrates 11B and 11C (Because being Formed by Almost the Same Method, a Case of the Semiconductor Substrate 11B Will be Described)

Figure 7A:
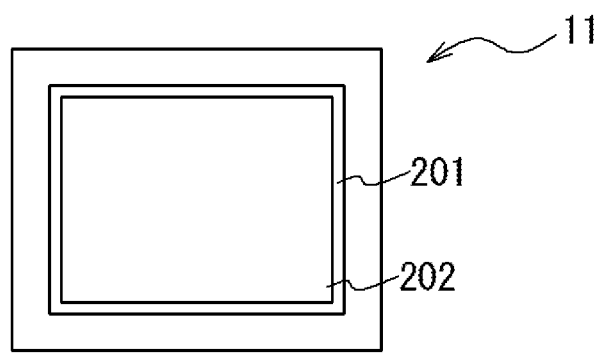
FIG. 7A is a plan view schematically showing the multichip module manufacturing method according to an embodiment.
Figure 7B:
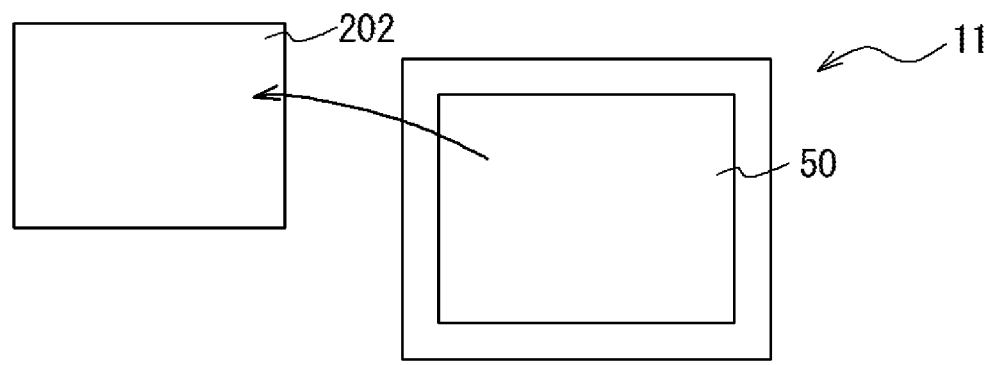
FIG. 7B is a plan view schematically showing the multichip module manufacturing method according to the embodiment.

The method of forming a semiconductor substrate 11B is same as a case of the semiconductor substrate 11A. Moreover, a process of forming a predetermined region (a space) 50B is added. That is, before and after the process of forming a via-hole or at the same time as the above process, a process of forming a predetermined region (the space) 50B is carried out. Specifically, the substrate 40A in the position of the predetermined region (the space) 50B is etched to form a space (a hole) which reaches the first surface from the second surface. The space (the hole) functions as the predetermined region (the space) 50B. For example, the etching to such a relatively large region can be realized by using the technique of an MEMS manufacture. In more detailed, referring to FIG. 7A, a frame-like passing-through ditch 201 is formed on the semiconductor substrate 11 by the etching exemplified by DeepRIE. Next, as shown in FIG. 7B, an inside region 202 in the passing-through ditch 201 from the semiconductor substrate 11 is excluded. Thus, by the region from which the internal region 202 of the semiconductor substrate 11 is excluded, the predetermined region (the space) 50 is formed.

Figure 8:
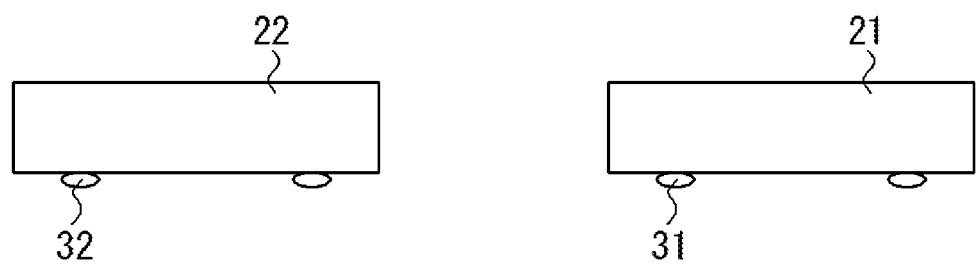
FIG. 8 is a sectional view schematically showing the multichip module manufacturing method according to the embodiment.

On the other hand, the plurality of semiconductor chips 21 and 22 are prepared as shown in FIG. 8. In this example, a memory in the condition of a die (bare chip) is prepared as the semiconductor chip 21 and a CPU in the condition of a die (bare chip) is prepared as the semiconductor chip 22. However, they may be a memory and a CPU in the condition of the package. Also, in this example, it is supposed that the semiconductor chip 21 is a memory and the semiconductor chip 22 is the CPU. However, an optional chip may be used in addition to this. Contrary to the embodiment, the semiconductor chip 21 which is provided in the predetermined region (the space) 50 may be a CPU, and the semiconductor chip 22 which is provided on the semiconductor substrate 11D may be a memory.

Figure 9:
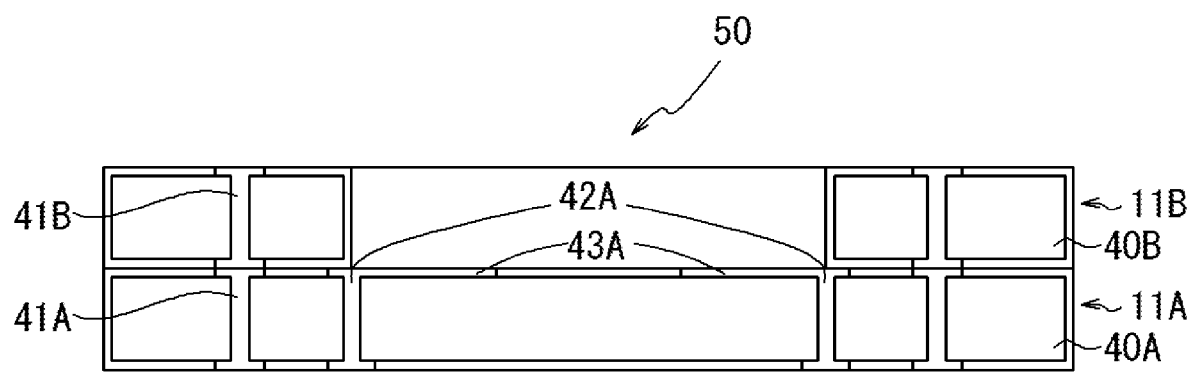
FIG. 9 is a sectional view schematically showing the multichip module manufacturing method according to an embodiment.
Figure 10:
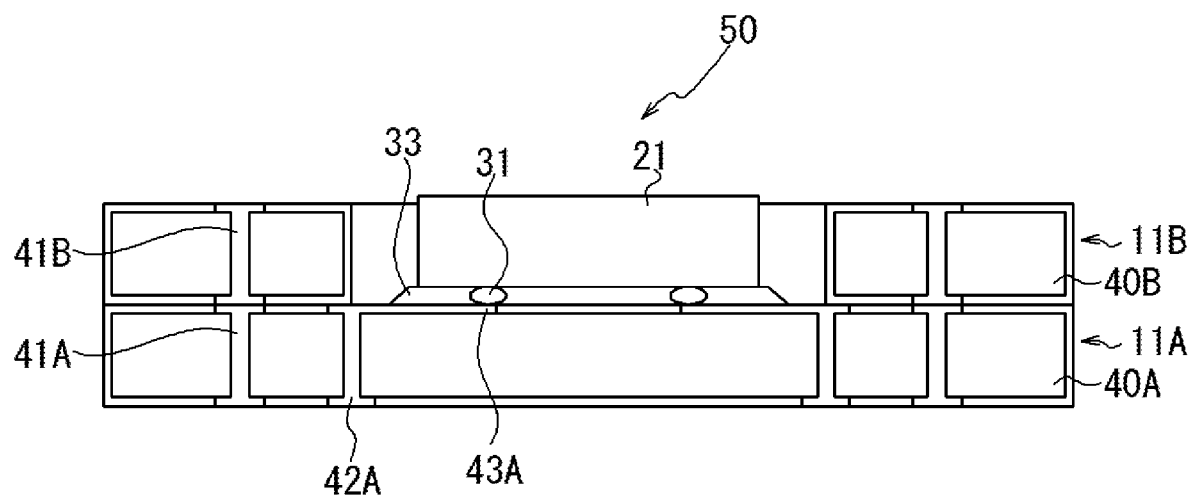
FIG. 10 is a sectional view schematically showing the multichip module manufacturing method according to the embodiment.

Next, the semiconductor substrate 11B is bonded with the semiconductor substrate 11A by the room-temperature bonding method as shown in FIG. 9. At this time, one of the surfaces of the semiconductor substrate 11A and one of the surfaces of the semiconductor substrate 11B are bonded such that the predetermined via-contacts 41A and 41B set previously for connection are connected. Here, an electrode to connect the via-contact and the substrate may be connected electrically or the electrode may leave. Next, the semiconductor chip 21 is mounted (arranged) on the semiconductor substrate 11A in the predetermined region (the space) 50 as shown in FIG. 10. At this time, the metal electrode 43A of the semiconductor substrate 11A and a bump (gold, solder, etc.) 31 of the semiconductor chip 21 are connected in the flip chip method. At this time, an under fill material 33 may be filled between the semiconductor substrate 11A and the semiconductor chip 21.

Figure 11:
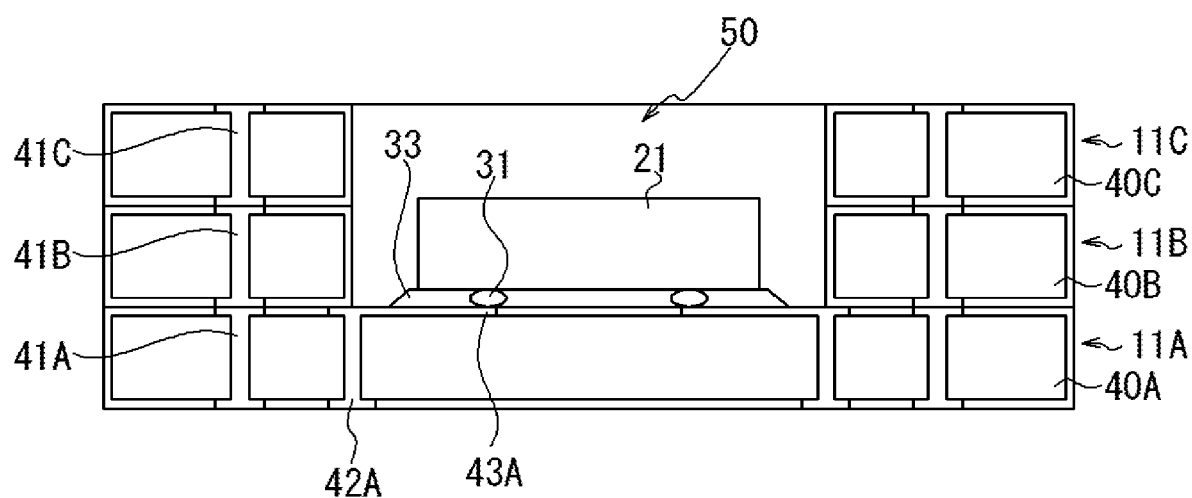
FIG. 11 is a sectional view schematically showing the multichip module manufacturing method according to the embodiment.

Next, as shown in FIG. 11, the semiconductor substrate 11C is bonded with the semiconductor substrate 11B which has been bonded with the semiconductor substrate 11, by the room-temperature bonding method. At this time, the other surface of the semiconductor substrate 11B and one of the surfaces of the semiconductor substrate 11C are bonded such that the predetermined via-contacts 41B and 41C set previously for the connection are connected. A method disclosed in Japanese Patent No. 3970304 is exemplified as the room-temperature method. As a result, the predetermined region (the space) 50 is formed on the semiconductor substrate 11A to be surrounded by the semiconductor substrates 11B and 11C.

Figure 12:
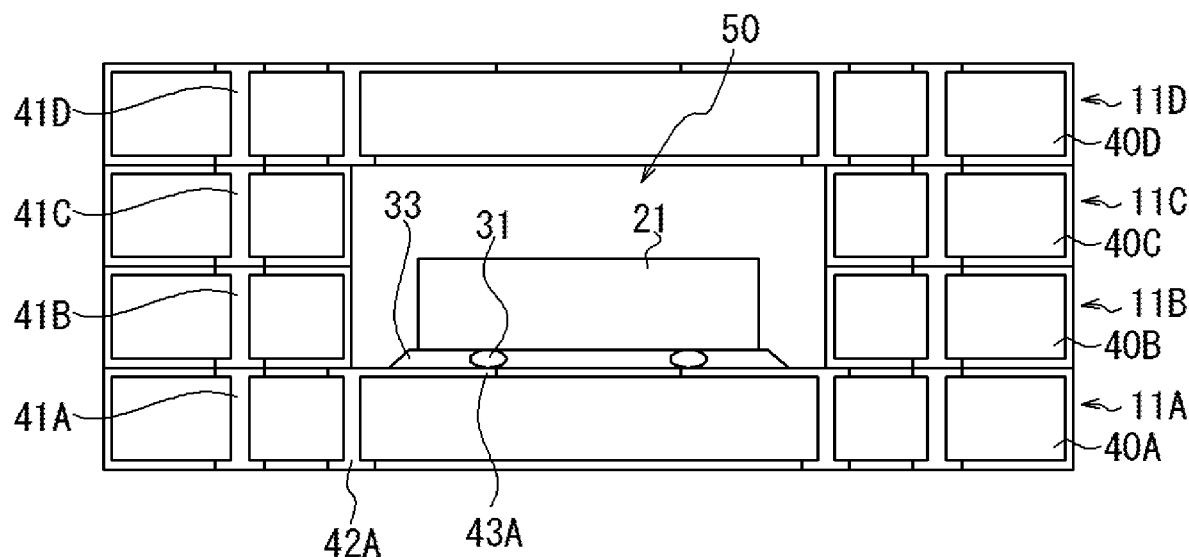
FIG. 12 is a sectional view schematically showing the multichip module manufacturing method according to an embodiment.
Figure 13:
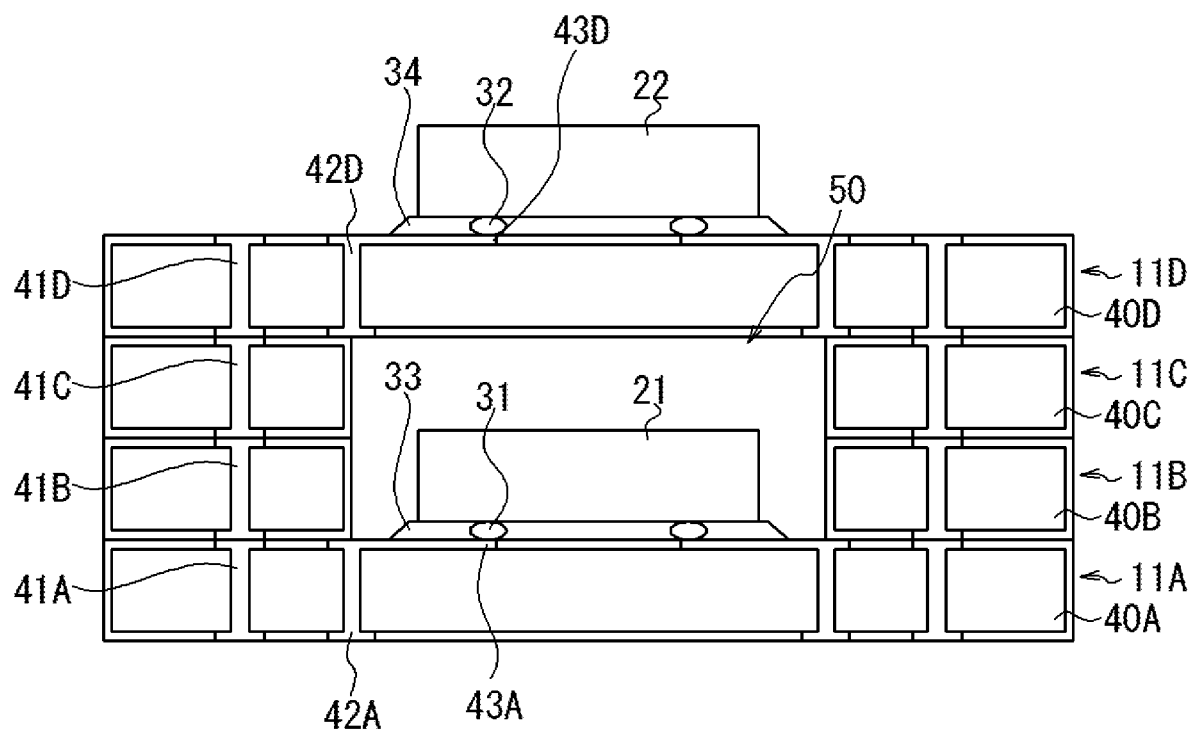
FIG. 13 is a sectional view schematically showing the multichip module manufacturing method according to the embodiment.

After that, the semiconductor substrate 11D is bonded to the semiconductor substrate 11C by the room-temperature bonding method as shown in FIG. 12. At this time, one of the surfaces of the semiconductor substrate 11D and the other surface of the semiconductor substrate 11C are bonded such that predetermined via-contact 41C and via-contact 41D which are previously set for connection are connected. As the room-temperature bonding method, a technique disclosed in Japanese Patent No. 3970304 is exemplified. As a result, the predetermined region (the space) 50 is formed on the semiconductor substrate 11A to be surrounded by the semiconductor substrates 11B, 11C and 11D Moreover, the semiconductor chip 22 is mounted (arranged) on the semiconductor substrate 11D as shown in FIG. 13. At this time, a metal electrodes 43D of the semiconductor substrate 11D and bumps (gold, solder, etc.) 32 of the semiconductor chip 22 are connected by the flip chip method. At this time, under fill material 34 may be filled between the semiconductor substrate 11D and the semiconductor chip 22.

Next, the method of forming a wiring line which is common to the semiconductor substrates 11A to 11D will be described with reference to the attached drawings. Here, the configuration components will be described by using numerals obtained by removing alphabets from reference numerals of the semiconductor substrates 11A to 11D.

Referring to FIG. 14 to FIG. 21, a method of forming a wiring line to the semiconductor substrate 11 by a Cu wiring line process will be described.

Figure 14:
FIG. 14 is a sectional view schematically showing the multichip module manufacturing method according to an embodiment.

Referring to FIG. 14, a silicon substrate 40 is prepared on which an electronic device and a wiring line layer are formed in the surface region of the first surface. In this case, it is desirable to polish a second surface of the silicon substrate in order to make it thin. Note that the silicon substrate 40 may not have the electronic device and the wiring line layer formed.

Figure 15:
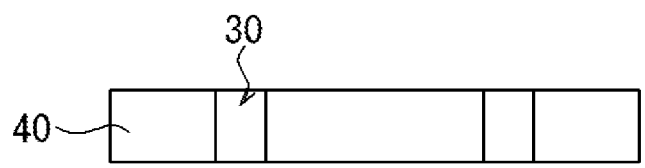
FIG. 15 is a sectional view schematically showing the multichip module manufacturing method according to the embodiment.

Referring to FIG. 15, the via-hole 30 is formed to connect the first surface and the second surface in the silicon substrate 40. In this case, as an example, the via-hole 30 is provided in a predetermined position of the silicon substrate 40 by DeepRIE (Deep Reactive Ion Etching).

Figure 16:
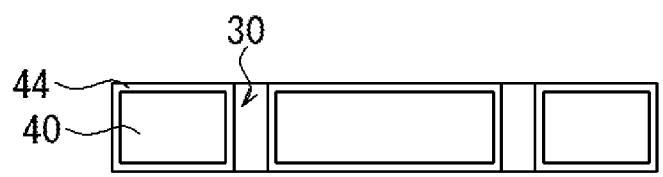
FIG. 16 is a sectional view schematically showing the multichip module manufacturing method according to the embodiment.

Referring to FIG. 16, an insulating film 44 (e.g. SiO$_2$) is formed to cover the whole surface of silicon substrate 40 (the first surface, the second surface and side surfaces) and the inner wall of the via-hole 30.

Figure 17:
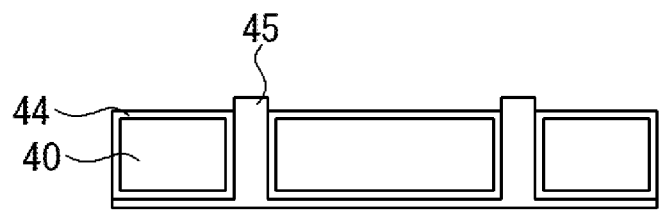
FIG. 17 is a sectional view schematically showing the multichip module manufacturing method according to the embodiment.

Referring to FIG. 17, a barrier film (e.g. TiN) (not shown) is formed on the surface of the insulating film 44 by, for example, a sputtering method, and then a metal film is embedded in the via-hole 30. Here, by a Cu electrolysis plating method, a Cu film 45 is formed on the second surface and embedded in the via-hole 30. At this time, the Cu 45 film may be plated directly on the barrier film. However, to improve the fitting of the Cu film 45 and the barrier layer, a Cu seeding layer (e.g. Cu/Ti) may be formed on the barrier film and the Cu film 45 may be plated on the Cu seeding layer.

Figure 18:
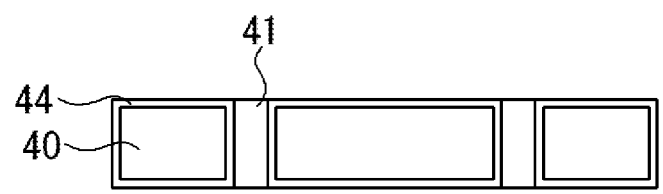
FIG. 18 is a sectional view schematically showing the multichip module manufacturing method according to the embodiment.

Referring to FIG. 18, the Cu film 45 formed on the second surface and the first surface is removed by polishing which is exemplified by CMP, to expose and flatten the first surface and the second surface. Thus, the via-contact 41 in which the Cu film 45 is embedded is formed. At this time, although being not shown in FIG. 18 to FIG. 21, it does not need to say that the via-contact 42A mentioned above are formed in the same way.

Figure 19:
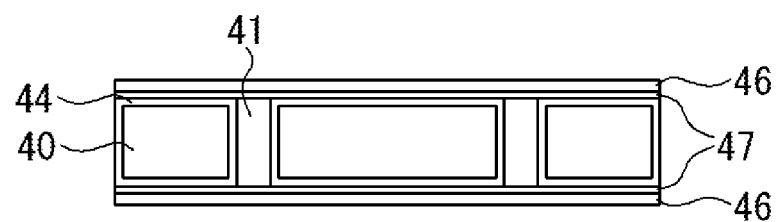
FIG. 19 is a sectional view schematically showing the multichip module manufacturing method according to the embodiment.

Referring to FIG. 19, for example, a metal film is formed on the first surface and the second surface by depositing (or sputtering). It is desirable that the outermost surface of the metal film is formed of an Au film 46 from the viewpoint of the conductivity. Also, it is desirable that a Ti film 47 is formed between the insulating film 44 and the Au film 46 to improve the adhesion of the insulating film 44 and the Au film 46. In an example shown in FIG. 19, the Ti film 47 and the Au film 46 are formed in order on the insulating film 44 and the via-contact 41 in the first surface and the second surface, to form an Au/Ti metal film.

Figure 20:
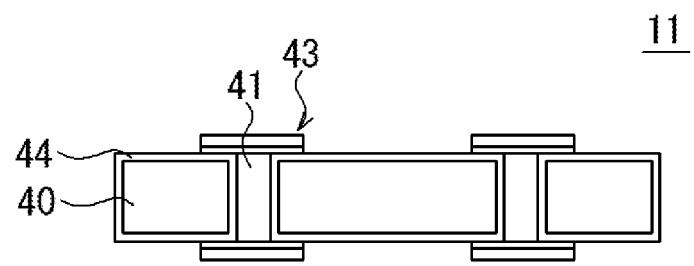
FIG. 20 is a sectional view schematically showing the multichip module manufacturing method according to the embodiment.

Referring to FIG. 20, a wiring line pattern (not shown) is formed on the Au film 46 in the first surface and the second surface by, for example, a Ti mask, and an Au/Ti metal electrode 43 and wiring lines (not shown) are formed by a dry etching method. Thus, the semiconductor substrate 11 is formed which contains the via-contact 41 formed of Cu, and the metal electrode 43 formed of the Au/Ti metal film, and the wiring lines (not shown).

Figure 21:
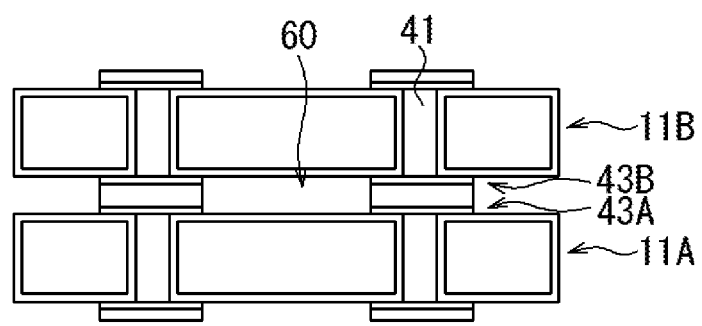
FIG. 21 is a sectional view schematically showing the multichip module manufacturing method according to the embodiment.

Referring to FIG. 21, a plurality of silicon substrates 11 formed as mentioned above are bonded and is implemented as a multichip module. For example, the semiconductor substrate 11A and the semiconductor substrate 11B are bonded through a metal electrode 43A and a metal electrode 43B by the room-temperature bonding method. At this time, the space 60 is generated between the surfaces of the semiconductor substrate 11A and the semiconductor substrate 11B opposing to each other. The height depends on the metal electrode 43 and is as small as the several nanometers. Also, when the substrates are bonded in the vacuum chamber, the space 60 becomes vacuum if the periphery of the space 60 is surrounded by the metal wiring lines 43A and 43B connected to each other. When air is present in the space 60, there is a fear that the bonding section is damaged due to a pressure difference between the space 60 and the outside in the environment that the multichip module 1 operates in the vacuum. Also, when the air is present in the space 60, there is a fear that dewfall occurs. On the other hand, when the space 60 is a vacuum, these problems do not occur.

Note that although being not shown, the space 60 may be filled with an oxide film. For example, after the oxide film is formed on the first surface and the second surface of the semiconductor substrate 11 shown in FIG. 20, the metal electrode 43 and wiring lines (not shown) are exposed through a flattening process. Thus, the oxide film is formed to have the height of the same surface as the surface of metal wiring line 43. By boding the semiconductor substrates 11 of such a configuration, the multichip module 1 with no space 60 is formed.

For example, the structure of the metal electrode 43 to be formed here is not limited to this structure and the composition and the number of layers can be selected optionally such as the Au/Ni/Ti metal film and the Au/Pt/Ti metal film. By inserting a Ni layer having a high heat resistance between the Au layer and the Ti layer, the electrode damaging due to the heat can be prevented. For example, when a surface mounting part 25 is connected with the metal electrode 43 by using solder, the temperature of 200 to 300 degrees is applied to the metal electrode 43. In this case, by forming the metal electrode 43 to have the structure of the Au/Ni/Ti metal film, the damaging of the metal electrode 43 caused due to the soldering can be prevented. Here, the surface mounting part 25 is exemplified by any of the semiconductor chips 21 and 22, and semiconductor chips 23 and 24 or chip parts 71 and 72, to be described later, and an electronic part of a chip shape mountable on the semiconductor substrate 11.

Referring to FIG. 14 to FIG. 18, and FIG. 22 to FIG. 25, a method of manufacturing the semiconductor substrate 11 having the metal electrode 43 using the Au/Ni/Ti metal film and a mounting example of the surface mounting part 25 by soldering will be described.

Referring to FIG. 14 to FIG. 18, because the process to a steep of forming the via-contact 41 to the silicon substrate 40 is same as the above-mentioned process, the description is omitted.

Figure 22:
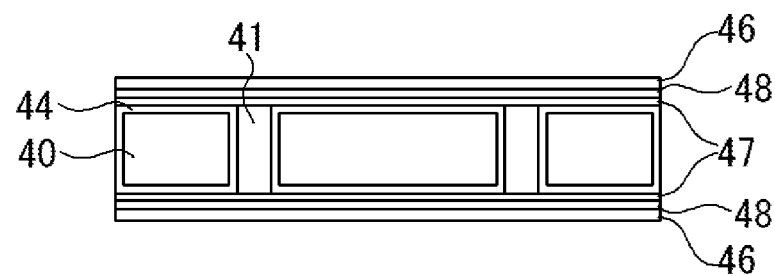
FIG. 22 is a sectional view schematically showing the multichip module manufacturing method according to the embodiment.

Referring to FIG. 22, the Ti film 47, the Ni film 48 and the Au film 46 are formed in order on the via-contact 41 and the insulating film 44 of the first surface and the second surface by, for example, sputtering, to form the Au/Ni/Ti metal film.

Figure 23:
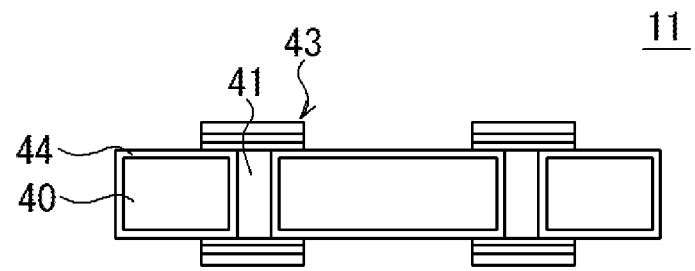
FIG. 23 is a sectional view schematically showing the multichip module manufacturing method according to the embodiment.

Referring to FIG. 23, a wiring line pattern (not shown) by, for example, the Ti mask is formed on the Au films 46 of the first surface and the second surface, to form the Au/Ni/Ti metal electrode 43 and the wiring lines (not shown) by a dry etching. Thus, the semiconductor substrate 11 is formed to contain the via-contact 41 formed of Cu, and the metal electrode 43 formed from the Au/Ni/Ti metal film, and the wiring lines (not shown).

Figure 24:
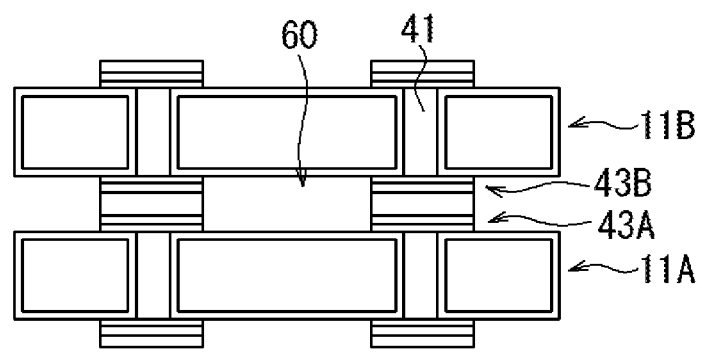
FIG. 24 is a sectional view schematically showing the multichip module manufacturing method according to the embodiment.

Referring to FIG. 24, the plurality of silicon substrates 11 manufactured as mentioned above are bonded to be implemented as the multichip module. For example, the semiconductor substrate 11A and the semiconductor substrate 11B are bonded through the metal electrode 43A and the metal electrode 43B by the room-temperature bonding method. At this time, it is same as mentioned above that the space 60 is formed between the surfaces of the semiconductor substrate 11A and the semiconductor substrate 11B opposing to each other and the height is several-nm order. Also, it is the same as mentioned above that the space 60 may be filled with the insulating film.

Figure 25:
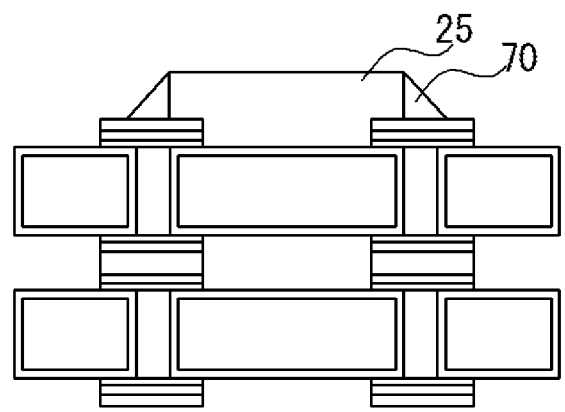
FIG. 25 is a sectional view schematically showing the multichip module manufacturing method according to the embodiment.

Referring to FIG. 25, because the metal electrode 43 of the present embodiment contains Ni having high heat resistance, the heat damaging does not occur even if the surface mounting part 25 is connected through the solder 70. That is, in the multichip module 1 of this example, the surface mounting part 25 can be mounted on the semiconductor substrate 11 by soldering. Also, in the present embodiment, an example that the surface mounting part 25 is soldered through lead lines is shown, but the present embodiment is not limited to this. An example is effective where the electrodes on the surface of surface mounting part 25 and the metal electrodes 43 are connected through solder bumps.

In an example shown in FIG. 14 to FIG. 25, the method of manufacturing the multichip module 1 by using Cu wiring lines has been described. However, the wiring line material is not limited to the example, and Al wiring lines may be used.

Referring to FIG. 14 to FIG. 16, and FIG. 26 to FIG. 29, a method of forming wiring lines to the semiconductor substrate 11 by an Al wiring line process will be described.

Referring to FIG. 14 to FIG. 16, because the process to a step of forming the via-hole 30 and the insulating film 44 on the silicon substrate 40 is same as the above-mentioned process, the description is omitted.

Figure 26:
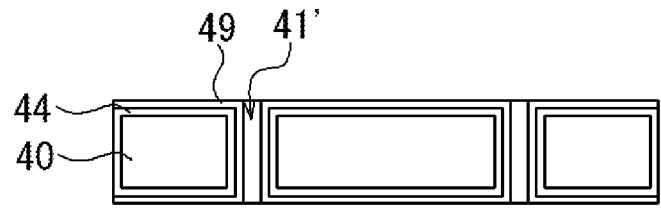
FIG. 26 is a sectional view schematically showing the multichip module manufacturing method according to the embodiment.

Referring to FIG. 26, Al films 49 are formed on the via-hole 30 and the insulating films 44 of the first surface and the second surface by a sputtering. A via-contact 41' is formed to connect the first surface and the second surface by the Al film 49 formed on the via-hole 30.

Figure 27:
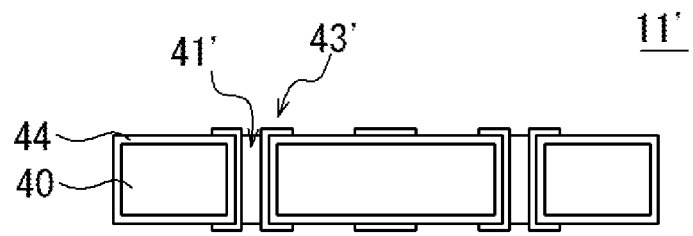
FIG. 27 is a sectional view schematically showing the multichip module manufacturing method according to the embodiment.

Referring to FIG. 27, a wiring line pattern (not shown) is formed on the Al films 49 of the first surface and the second surface by the Ti mask, and the Al metal electrode 43' and the wiring lines (not shown) are formed by dry etching. Thus, the semiconductor substrate 11' is formed to contain the via-contact 41', the metal electrode 43' and the wiring lines (not shown) which are formed from the Al film 49.

Figure 28:
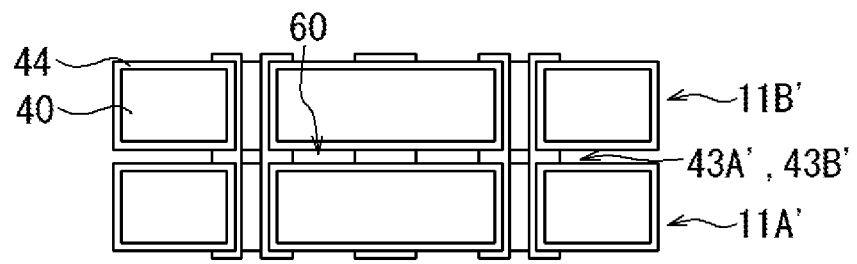
FIG. 28 is a sectional view schematically showing the multichip module manufacturing method according to the embodiment.

Referring to FIG. 28, the plurality of silicon substrates 11' formed as mentioned above are bonded as in the above-mentioned silicon substrate 11 and the bonded substrates are implemented as a multichip module. For example, the semiconductor substrate 11A' and the semiconductor substrate 11B' are bonded through metal electrodes 43A' and metal electrodes 43B' by the room-temperature bonding method. At this time, it is same as mentioned above that the space 60 is produced between the surfaces of the semiconductor substrate 11A and the semiconductor substrate 11B opposing to each other and the height is several-nm order. Also, it is same as mentioned above that the space may be filled with the insulating film.

Figure 29:
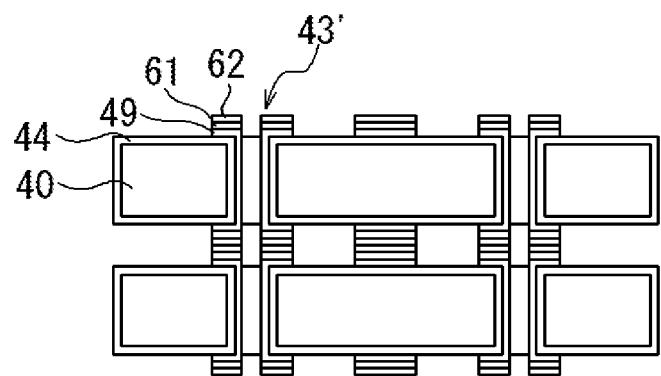
FIG. 29 is a sectional view schematically showing the multichip module manufacturing method according to the embodiment.

Here, the structure of the metal electrode 43' to be formed is not limited to this, and for example, the Au film 62 may be formed on the surface of the Al film 49 to improve conductivity. In this case, it is desirable that the Ti film 61 is formed between the Al film 49 and the Au film 62, in order to improve fitness with the Al film 49, as shown in FIG. 29. Also, the metal film formed on the Al film 49 can be selected optionally in composition and the number of layers, such as the Au/Ni/Ti metal film and the Au/Pt/Ti metal film as mentioned above. By inserting a Ni layer having high heat resistance between the Au layer and the Ti layer, the electrode damaging due to the heat can be prevented.

The multichip module according to the present embodiment is manufactured in this way.

Note that the manufacturing method of the multichip module of FIG. 14 to FIG. 28 is only an example, and the present embodiment is not limit to this example. For example, in the method of forming via-contact shown in FIG. 15 to FIG. 18, the via-hole 30 is provided to pass through silicon substrate 40 from the first surface to the second surface.

However, the via-hole may not pass through the silicon substrate 40. For example, by providing the via-hole 31 not to pass to the second surface, the via-contact (via) 42 may be formed as shown in FIG. 30 to FIG. 32.

Figure 30:
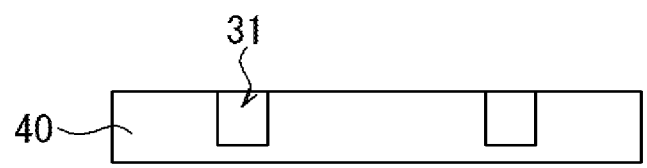
FIG. 30 is a sectional view schematically showing the multichip module manufacturing method according to an embodiment.

In detail, referring to FIG. 30, the via-hole 31 is provided in a predetermined position on the first surface of the silicon substrate 40 by DeepRIE. At this time, the via-hole 31 may be a hole with a predetermined depth from the first surface and is not necessary to pierce to the second surface.

Figure 31:
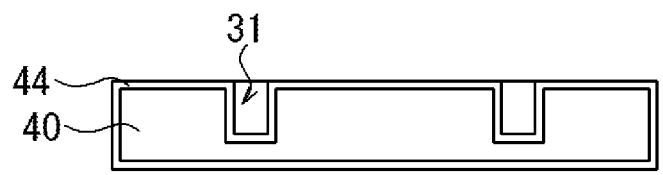
FIG. 31 is a sectional view schematically showing the multichip module manufacturing method according to the embodiment.

Referring to FIG. 31, the insulating film 44 (e.g. $SiO_2$) is formed to cover the whole surface of the silicon substrate 40 (the first surface, the second surface and the side planes) and the inner wall of the via-hole 31.

Figure 32:
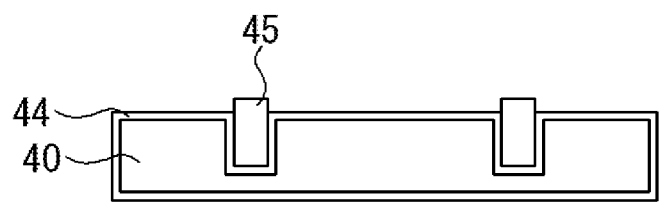
FIG. 32 is a sectional view schematically showing the multichip module manufacturing method according to the embodiment.

Referring to FIG. 32, after a barrier film (e.g. TiN) (not shown) is formed on the surface of the insulating film 44 by a sputtering method, a metal film is embedded in the via-hole 31. In this case, a Cu film 45 is embedded in the via-hole 31 by a Cu electrolysis plating method. At this time, the Cu film 45 may be plated directly on the barrier film. However, in order to improve the fitness between the Cu film 45 and the barrier layer, a Cu seeding layer (e.g. Cu/Ti) may be formed on the barrier film and the Cu film 45 may be plated on the Cu seeding layer.

Referring to FIG. 18, the Cu film 45 formed on the first surface and the second surface are removed by polishing which is exemplified by a CMP, and the first surface and the second surface are exposed to flatten. Thus, the via-contact 41 in which the Cu film 45 is embedded is formed.

As mentioned above, the via-contact 41 can be formed by using the via-hole 31 which does not pierce from the first surface of the silicon substrate 40 to the second surface.

Also, the configuration of the multichip module of FIG. 2A and FIG. 2B is an example and the present embodiment is not limited to this example. FIG. 32 to FIG. 37 are sectional views schematically showing modification examples of the configuration of the multichip module according to the present embodiment.

Figure 33:
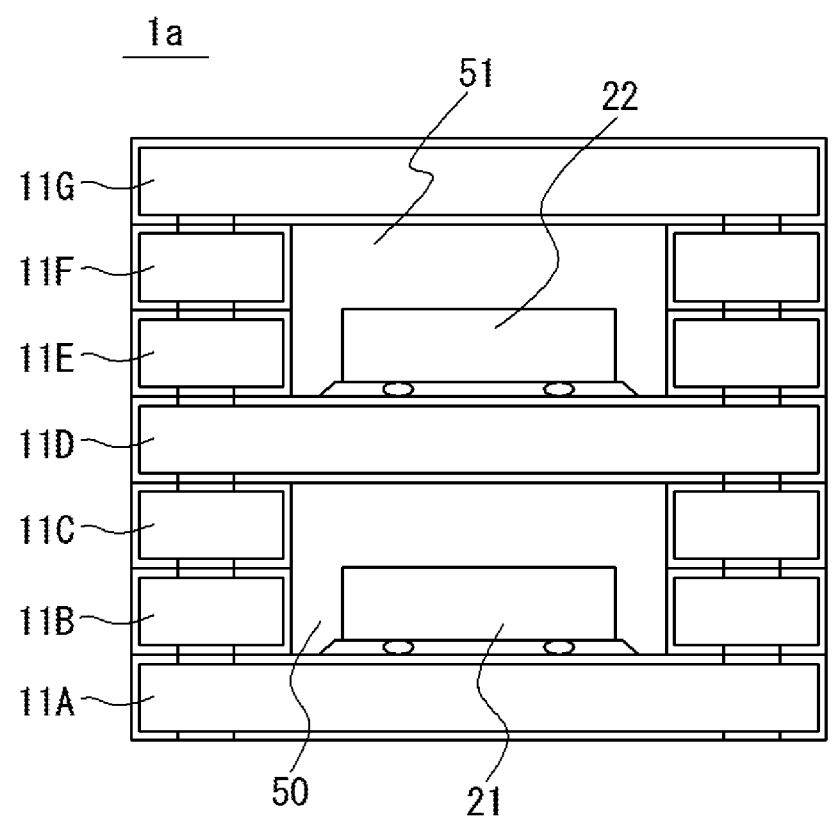
FIG. 33 is a sectional view schematically showing a modification example of the configuration of the multichip module according to an embodiment.

Moreover, in the multichip module of FIG. 33, the semiconductor substrates 11E, 11F, and 11G are stacked on the multichip module 1 of FIG. 2A. The semiconductor substrates 11E, 11F, and 11G have the almost same configuration as the semiconductor substrates 11B, 11C and 11D, respectively basically. The semiconductor substrates 11E and 11F are stacked on the semiconductor substrate 11D to surround the semiconductor chip 22 (surround a predetermined region (space) 51). The semiconductor substrate 11G is stacked on the semiconductor substrate 11F to cover above the semiconductor chip 22 (to cover the predetermined region 51). Although being not shown, the semiconductor substrate and the semiconductor chip are stacked in further upward direction by the same method.

Figure 34:
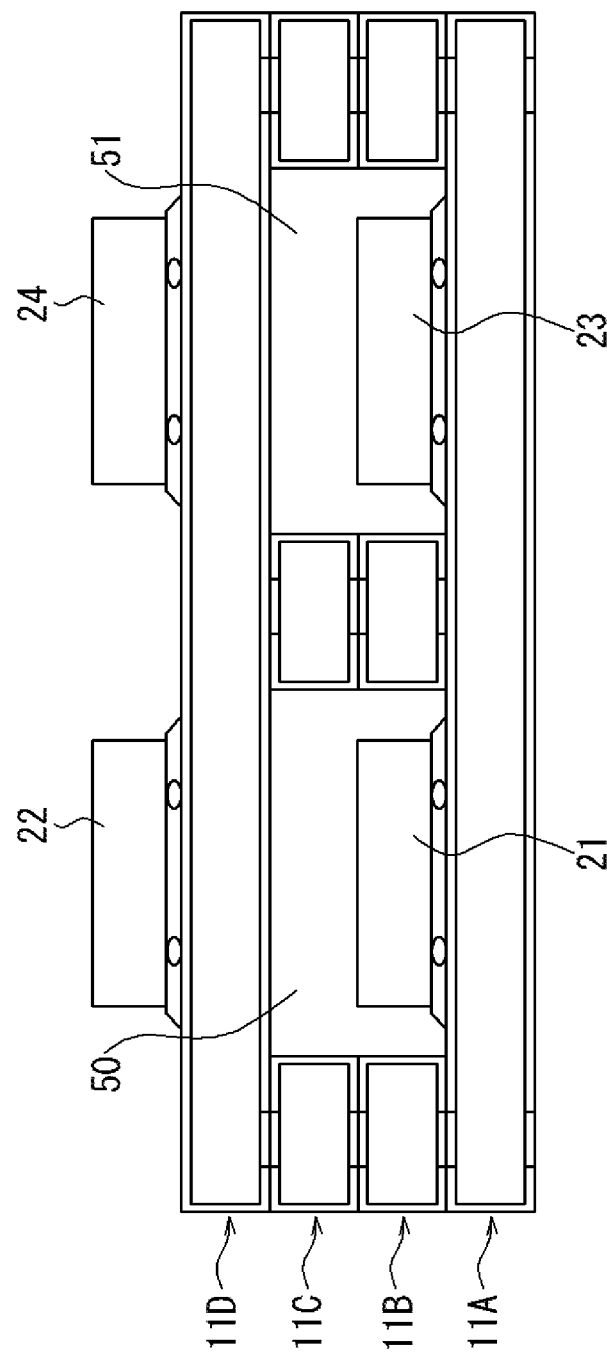
FIG. 34 is a sectional view schematically showing the modification example of the configuration of the multichip module according to the embodiment.

In the multichip module 1b of FIG. 34, the predetermined region (space) 51 is provided for the multichip module 1 of FIG. 2A, and the semiconductor chip 23 as the surface mounting part is mounted (arranged) there. Such a configuration can be realized by carrying out etching to form a separate predetermined region (space) 51 to the semiconductor substrates 11B and 11C, simultaneously with the etching to form the predetermined region (space) 50. Moreover, the semiconductor chip 24 may be mounted (arranged) on the semiconductor substrate 11D. Although being not shown, it is possible to increase the number of predetermined regions (spaces) and to arrange semiconductor chips, by the same method.

Figure 35:
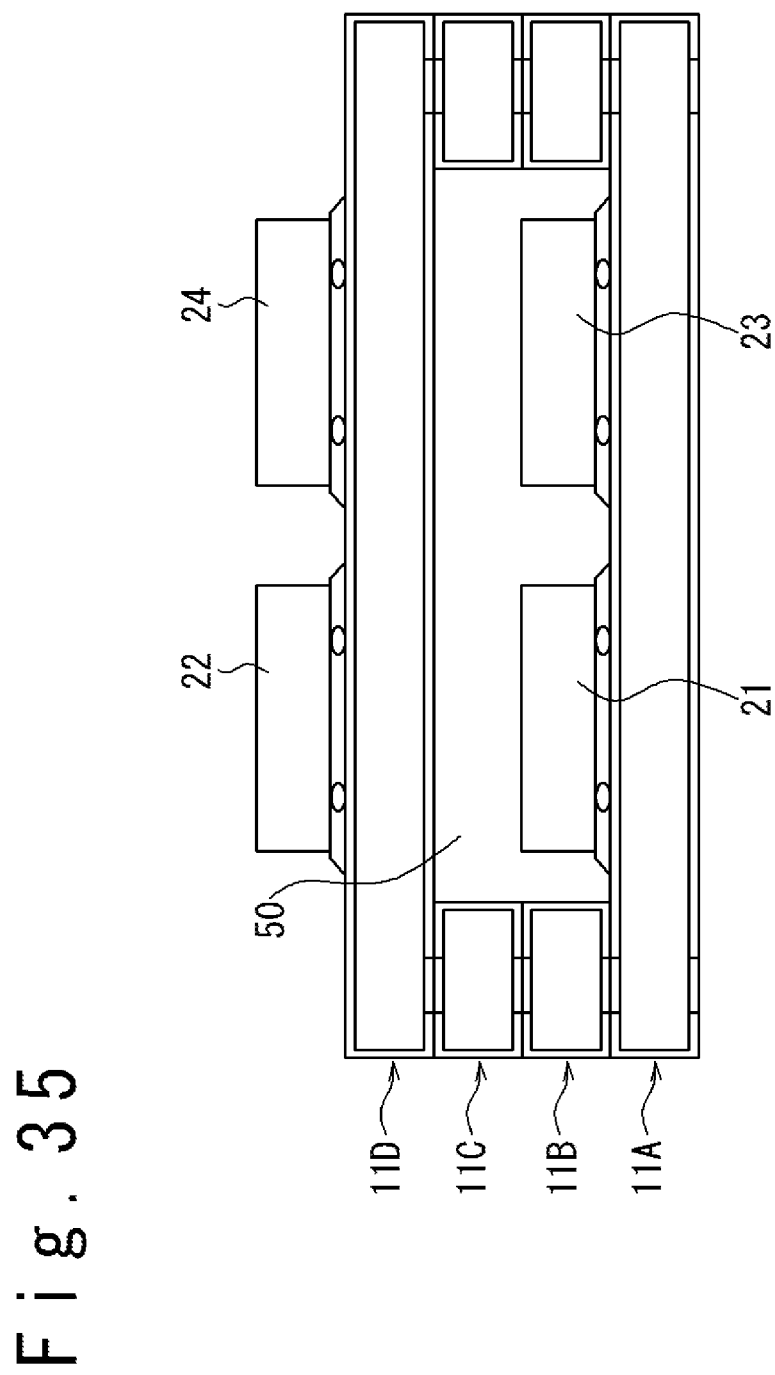
FIG. 35 is a sectional view schematically showing the modification example of the configuration of the multichip module according to the embodiment.

Moreover, in a multichip module 1c of FIG. 35, the semiconductor chip 23 is mounted (arranged) in the predetermined region (space) 50 of the multichip module 1 of FIG. 2A. Such a configuration can be realized by extending the predetermined region when carrying out etching to the semiconductor substrates 11B and 11C to form the predetermined region (space) 50. Moreover, the semiconductor chip 24 s the surface mounting part may be mounted (arranged) on the semiconductor substrate 11D. Although being not shown, by increasing the number of predetermined regions (spaces), the semiconductor chips can be arranged in the same method.

Also, the multichip module of the present embodiments may be a multichip module in which all or part of the configurations of the multichip modules of FIG. 2A, FIG. 2B, FIG. 3A, FIG. 3B and FIG. 33 to FIG. 35 are combined.

Moreover, in the above, the multichip module 1 on which the semiconductor chips 21 to 24 are mounted is shown as examples. However, if the surface mounting part is mounted, the embodiment is not limit to this. For example, the multichip module 1 according to the present invention may be mounted with chip parts 71 and 72 as the surface mounting parts in place of the semiconductor chips 21 to 24. For example, the chip parts 71 and 72 are passive components with a chip shape exemplified by a chip resistor, a chip condenser, and a chip inductor.

Figure 36:
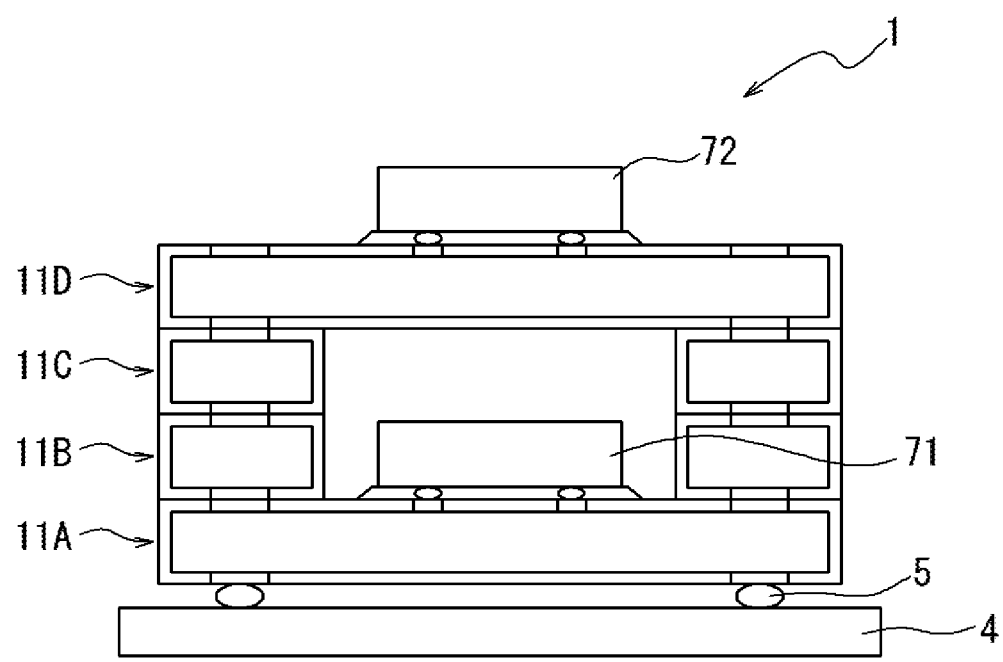
FIG. 36 is a sectional view schematically showing the modification example of the configuration of the multichip module according to the embodiment.

An example of mounting the chip parts 71 and 72 on the multichip module 1 according to the present invention is shown in FIG. 36 and FIG. 37. Referring to FIG. 36, the chip parts 71 and 72 are mounted on the multichip module 1 in place of the semiconductor chips 21 and 22 shown in FIG. 2A. Or, referring to FIG. 37, the semiconductor chips 21 and 22 and the chip parts 71 and 72 may be mixedly mounted on the multichip module 1. Also, although being not shown, the chip part may be mounted in place of the semiconductor chips 21 to 24 as shown in FIG. 3A, FIG. 33, FIG. 34, and FIG. 35, and the semiconductor chip and the chip part may be mixedly mounted. Moreover, the above-mentioned embodiments may be combined in a range without technical contradiction. Note that the number of surface mounting part, and the kind, size and arrangement position of the surface mounting part mounted on the multichip module 1 can be optionally set.

The multichip module of the present embodiment adopts a semiconductor substrate (e.g. silicon substrate) as a mount substrate but does not use the substrate made of resin and the substrate made from ceramic. Thus, the wiring lines according to a wiring line rule of the semiconductor substrate can be used as the wiring line of the mount substrate. As a result, the wiring line can be miniaturized, the area of the wiring line to be occupied in the mount substrate can be reduced, and the mount substrate can be downsized and be made in a high density. In addition to them, the multilayer configuration of the semiconductor substrates (e.g. silicon substrates) is realized by using the wiring line passing through the semiconductor substrate. Moreover, an IC chip is embedded in the inside of the multilayer configuration. Thus, the multichip module 1 in which a CPU is mounted can be configured to the height direction three-dimensionally. In this way, the base area of the multichip module can be reduced without changing the area of the whole mount substrate. In an example of FIG. 2A, the area required to arrange the multichip module can be reduced to the area of the semiconductor substrate 11A (for one) is the multichip module takes without changing the areas of the semiconductor substrates 11A to 11D (for four). In this way, the multichip module can be remarkably downsized and made in a high density. Also, when using a semiconductor substrate (e.g. silicon) as the mount substrate, it is predominant in the viewpoint of the thermal radiation design of a part (e.g. semiconductor chip like the CPU), because the heat conduction is better compared with a substrate made from resin and a substrate made from ceramics.

Also, in the multichip module of the present embodiment, a semiconductor chip is embedded inside the stack configuration of a plurality of semiconductor substrates (e.g. silicon substrates). Therefore, theoretically, there is no limitation of stacking in the height direction with respect to the multichip module, and very many semiconductor substrates can be stacked. Therefore, a super-high-density CPU module can be realized. Also, because the plurality of semiconductor substrates (e.g. silicon substrates) are bonded by the room-temperature bonding, a heat load is never applied to the surface mounting part exemplified by an IC chip. Therefore, there is no fear of breaking the surface mounting part exemplified by the IC chip in assembling step and the yield is improved.

The multichip module of the present embodiment is suitable especially for the multichip module having a sensor function and an analog function in addition to a digital function. For example, the present invention is suitable especially for a multichip module dealt with in HIC and MCM and difficult to deal with in SOC like a case of combining a digital IC and a sensor IC and an analog IC.

Also, the on board computer of the present embodiment using these multichip modules can achieve the similar effect.

As shown above, in the multichip module of the present embodiment and the on board computer using it, the CPU and the peripheral IC (memory and so on) can be made three-dimensionally through the implementation using a room-temperature bonding technique, compared with the substrate on which a conventional CPU is mounted. Thus, the multichip module and the on board computer can be remarkably downsized and can be formed in a high density. Also, when using a semiconductor substrate like silicon substrate as the mount substrate, the present invention is predominant in point of the thermal radiation design of a part (CPU) because the module is better in the heat conduction, compared with a substrate made from resin and a substrate made from ceramics.

In the multichip module according to the present embodiment, a mounted chip is not limited to an IC chip and a memory chip. The mounted chip may include a chip (MEMS: Micro Electro Mechanical Systems) having a machine element such as a sensor and an actuator. In this case, the multichip module can be called a MEMS module.

The present invention is not limited to each of the above embodiments. It would be clear that each embodiment can be changed or modified appropriately in a range of the technical thought of the present invention.

The present application is based on Japanese Patent Application No. JP 2014-046582, and claims a priority based on the Japanese Application. The disclosure thereof is incorporated herein by reference.

The invention claimed is:

1. A multichip module comprising:
   a plurality of semiconductor substrates, each having a wiring line region in which a wiring line passes through the semiconductor substrate from one surface toward another surface; and
   a plurality of surface mounting parts mounted on any of the plurality of semiconductor substrates,
   wherein the plurality of semiconductor substrates are stacked and bonded without gaps between the plurality of semiconductor substrates in a first direction to form a multilayer structure, and
   a first surface mounting part as at least one of the plurality of surface mounting parts is arranged in an inner space of the multilayer structure,
   wherein the plurality of semiconductor substrates comprises:
   a first semiconductor substrate on which the first surface mounting part is mounted;

a second semiconductor substrate stacked on the first semiconductor substrate and having 1) a first surface, 2) a second surface, and 3) a penetrating hole which reaches the first surface from the second surface in the first direction; and a third semiconductor substrate stacked over the first semiconductor substrate and the second semiconductor substrate, wherein the inner space is arranged between the first semiconductor substrate and the third semiconductor substrate in the first direction and includes the penetrating hole of the second semiconductor substrate, wherein a second surface mounting part as at least one of the plurality of surface mounting parts is arranged in the inner space together with the first surface mounting part, and wherein the inner space starts from a surface of the first semiconductor substrate on which the first surface mounting part and the second semiconductor substrate are connected and ends on a surface of the third semiconductor substrate.

2. The multichip module according to claim 1, wherein the inner space is opened in a second direction different from the first direction.

3. The multichip module according to claim 1, wherein a third surface mounting part as at least one of the plurality of surface mounting parts is mounted on the third semiconductor substrate and outside the inner space.

4. The multichip module according to claim 1, wherein a fourth surface mounting part as at least one of the plurality of surface mounting parts is arranged in another inner space of the multilayer structure.

5. The multichip module according to claim 1, wherein the plurality of surface mounting parts comprises a semiconductor chip.

6. The multichip module according to claim 5, wherein the semiconductor chip comprises a CPU (Central Processing Unit) or a memory.

7. The multichip module according to claim 1, wherein the plurality of surface mounting parts comprises a chip part.

8. The multichip module according to claim 1, wherein the plurality of surface mounting parts comprises an ASIC (Application Specific Integrated Circuit) or a sensor.

9. An on board computer comprising:
a multichip module arranged on a mount substrate; and
an interface configured to carry out input and output of data of the multichip module,
wherein the multichip module comprises:
a plurality of semiconductor substrates, each having a wiring line region in which a wiring line passes through the semiconductor substrate from one surface toward another surface; and
a plurality of surface mounting parts mounted on any of the plurality of semiconductor substrates,
wherein the plurality of semiconductor substrates are stacked and bonded without gaps between the plurality of semiconductor substrates in a first direction to form a multilayer structure, and
a first surface mounting part as at least one of the plurality of surface mounting parts is arranged in an inner space of the multilayer structure,
wherein the plurality of semiconductor substrates comprises:
a first semiconductor substrate on which the first surface mounting part is mounted;
a second semiconductor substrate stacked on the first semiconductor substrate and having 1) a first surface, 2) a second surface, and 3) a penetrating hole which reaches the first surface from the second surface in the first direction; and a third semiconductor substrate stacked over the first semiconductor substrate and the second semiconductor substrate, wherein the inner space is arranged between the first semiconductor substrate and the third semiconductor substrate in the first direction and includes the penetrating hole of the second semiconductor substrate, wherein a second surface mounting part as at least one of the plurality of surface mounting parts is arranged in the inner space together with the first surface mounting part, and wherein the inner space starts from a surface of the first semiconductor substrate on which the first surface mounting part and the second semiconductor substrate are connected and ends on a surface of the third semiconductor substrate.

10. An interface substrate comprising:
a multichip module arranged on a mount substrate; and
an interface configured to carry out input and output of data of the multichip module,
wherein the multichip module comprises:
a plurality of semiconductor substrates, each having a wiring line region in which a wiring line passes through the semiconductor substrate from one surface toward another surface; and
a plurality of surface mounting parts mounted on any of the plurality of semiconductor substrates,
wherein the plurality of semiconductor substrates are stacked and bonded without gaps between the plurality of semiconductor substrates in a first direction to form a multilayer structure, and
a first surface mounting part as at least one of the plurality of surface mounting parts is arranged in an inner space of the multilayer structure,
wherein the plurality of semiconductor substrates comprises:
a first semiconductor substrate on which the first surface mounting part is mounted;
a second semiconductor substrate stacked on the first semiconductor substrate having 1) a first surface, 2) a second surface, and 3) a penetrating hole which reaches the first surface from the second surface in the first direction; and a third semiconductor substrate stacked over the first semiconductor substrate and the second semiconductor substrate, wherein the inner space is arranged between the first semiconductor substrate and the third semiconductor substrate in the first direction and includes the penetrating hole of the second semiconductor substrate, the plurality of surface mounting parts comprises an ASIC (Application Specific Integrated Circuit) or a sensor, wherein a second surface mounting part as at least one of the plurality of surface mounting parts is arranged in the inner space together with the first surface mounting part, and wherein the inner space starts from a surface of the first semiconductor substrate on which the first surface mounting part and the second semiconductor substrate are connected and ends on a surface of the third semiconductor substrate.

11. A method of manufacturing a multichip module, comprising:

preparing a first semiconductor substrate, a second semiconductor substrate and a third semiconductor substrate, each having a wiring line region which contains a wiring line to pass from one of the surfaces to the other surface;

stacking and bonding the second semiconductor substrate on the first semiconductor substrate without gaps between the second semiconductor substrate and the first semiconductor substrate, in a first direction, by a room-temperature bonding method;

mounting a first surface mounting part on a part of the first semiconductor substrate which is not covered with the second semiconductor substrate; and stacking and bonding the third semiconductor substrate on the second semiconductor substrate without gaps between the third semiconductor substrate and the second semiconductor substrate, in the first direction, by a room-temperature bonding method to cover the first surface mounting part, wherein the preparing the second semiconductor substrate comprises:

forming a penetrating hole which reaches a first surface of the second semiconductor substrate from the second surface of the second semiconductor substrate in the first direction, wherein an inner space is arranged between the first semiconductor substrate and the third semiconductor substrate in the first direction and includes the penetrating hole of the second semiconductor substrate, wherein a second surface mounting part as at least one of the plurality of surface mounting parts is arranged in the inner space together with the first surface mounting part, and wherein the inner space starts from a surface of the first semiconductor substrate on which the first surface mounting part and the second semiconductor substrate are connected and ends on a surface of the third semiconductor substrate.

12. The method of manufacturing a multichip module according to claim 11, further comprising:

mounting a third surface mounting part on the third semiconductor substrate and outside the inner space.

13. The method of manufacturing a multichip module according to claim 11, wherein the mounting the first surface mounting part comprises:

mounting a fourth surface mounting part on the first semiconductor substrate.

\* \* \* \* \*